(12) United States Patent
Beeson et al.

(10) Patent No.: US 7,378,686 B2
(45) Date of Patent: May 27, 2008

(54) LIGHT EMITTING DIODE AND SIDE EMITTING LENS

(75) Inventors: Karl W. Beeson, Princeton, NJ (US); Scott M. Zimmerman, Baskin Ridge, NJ (US)

(73) Assignee: Goldeneye, Inc., San Diego, CA (US)

( * ) Notice: Subject to any disclaimer, the term of this patent is extended or adjusted under 35 U.S.C. 154(b) by 323 days.

(21) Appl. No.: 11/253,175

(22) Filed: Oct. 18, 2005

(65) Prior Publication Data
US 2007/0085105 A1    Apr. 19, 2007

(51) Int. Cl.
*H01L 29/24* (2006.01)

(52) U.S. Cl. .................. 257/100; 257/88; 257/98; 362/307; 362/327; 362/337; 362/347; 362/555; 362/560; 362/611; 362/612; 362/613; 362/614; 362/615; 362/616; 362/617; 362/618; 362/619; 362/621; 362/622; 362/623; 362/624; 362/625; 362/627; 362/628; 362/629; 313/512; 385/148; 385/901

(58) Field of Classification Search .............. 257/88, 257/98, 100, E33.056, E33.059, E33.065, 257/E33.067, E33.068, E33.072, E33.073; 362/308, 327, 337, 347, 555, 560, 611–619, 362/621–625, 627–629; 313/512; 385/146, 385/901
See application file for complete search history.

(56) References Cited

U.S. PATENT DOCUMENTS

| | | | |
|---|---|---|---|
| 5,410,454 A | 4/1995 | Murase et al. | |
| 6,144,536 A | 11/2000 | Zimmerman et al. | |
| 6,185,357 B1 | 2/2001 | Zou et al. | |
| 6,186,649 B1 | 2/2001 | Zou et al. | |
| 6,473,554 B1 | 10/2002 | Pelka et al. | |
| 6,550,942 B1 | 4/2003 | Zou et al. | |
| 6,679,621 B2 | 1/2004 | West et al. | |
| 6,869,206 B2 | 3/2005 | Zimmerman et al. | |
| 6,932,496 B2 * | 8/2005 | Rizkin et al. | 362/299 |
| 6,940,101 B2 * | 9/2005 | Yano et al. | 257/98 |
| 7,078,732 B1 * | 7/2006 | Reeh et al. | 257/98 |
| 7,084,435 B2 * | 8/2006 | Sugimoto et al. | 257/99 |
| 2006/0066192 A1 * | 3/2006 | Beeson et al. | 313/112 |
| 2006/0278882 A1 * | 12/2006 | Leung et al. | 257/98 |

* cited by examiner

*Primary Examiner*—Lynne Gurley
*Assistant Examiner*—Meiya Li
(74) *Attorney, Agent, or Firm*—William Propp, Esq.

(57) ABSTRACT

The invention is an illumination system that incorporates a light emitting diode and a side-emitting light-recycling lens. The side-emitting light-recycling lens recycles part of the light internally generated by a light emitting diode back to the light emitting diode as externally incident light. The light emitting diode reflects a portion of the recycled light, thereby increasing the effective brightness of the light emitting diode. The light reflected by the light emitting diode is directed though the side-emitting light-recycling lens and exits the illumination system, thereby increasing the output brightness and efficiency of the illumination system. The light emitting diode reflects externally incident light with a reflectivity greater than 40 percent.

27 Claims, 11 Drawing Sheets

LIGHT EMITTING DIODE AND SIDE EMITTING LENS
BEESON ET AL

LIGHT EMITTING DIODE AND SIDE EMITTING LENS
BEESON ET AL

LIGHT EMITTING DIODE AND SIDE EMITTING LENS

CROSS REFERENCE TO RELATED APPLICATION

This application is related to U.S. patent application Ser. No. 11/253,174 entitled "SIDE EMITTING ILLUMINATION SYSTEMS INCORPORATING LIGHT EMITTING DIODES," which is filed concurrently with this application and which is herein incorporated by reference.

TECHNICAL FIELD

The present invention is an illumination system that includes a light emitting diode and a side-emitting light-recycling lens.

BACKGROUND

Light emitting diodes (LEDs) are rapidly replacing incandescent and fluorescent light sources in many illumination systems. LEDs emit light in the ultraviolet, visible and infrared regions of the optical spectrum. Gallium nitride (GaN) based LEDs, for example, emit light in the ultraviolet, blue, cyan and green spectral regions. AlGaInP LEDs emit light in the yellow and red regions of the optical spectrum.

Some illumination applications require a thin, low profile structure. For example, a backlight for a liquid crystal display (LCD) on a laptop computer or desktop computer monitor presently uses one or more thin cold cathode fluorescent lamps (CCFLs) that are coupled into a thin transparent optical waveguide. The waveguide is a solid plastic sheet that has surface features, such as grooves or roughened areas or white painted spots, which scatter light out of the waveguide to form a thin uniform source of light. The light exiting the backlight is directed predominately perpendicular to the plane of the waveguide. The light emitted by the thin planar waveguide is directed through the LCD panel to the person viewing the display. For relatively small displays, one can replace the CCFL light source with an array of LEDs that are positioned along the edges of the waveguide.

Larger displays, in particular LCD television displays, require a large area backlight. As the backlight become larger, it is no longer convenient to place LED light sources along the edges of the waveguide. When the LEDs are placed only along the edges of the waveguide, the edges of the display may be brighter than the center of the display, which is undesirable. In order to have a uniformly bright LED-based backlight, the LEDs must be embedded within holes scattered across the area of the waveguide. A side emitting LED structure is desired for these types of applications.

For a very large LCD television such as a 37-inch or larger diagonal display, the solid plastic waveguide becomes very heavy and expensive. In addition, the plastic material such as acrylic that is used for the waveguide absorbs a considerable amount of blue light. For these very large displays, it is desirable to get rid of the plastic waveguide altogether and use a reflecting box that contains the light sources and is filled with air. However, the air filled box still needs to be thin. If LEDs are utilized as the light source, it is preferred that the LED structures be side emitting LED structures in order to spread the emitted light over a large area of the LCD display and to prevent bright spots in the portions of the display directly in front of the LEDs.

An important parameter to consider in the design of LED-based LCD backlights is the reflectivity of the LEDs to externally incident light. Many commercially available LEDs, including the GaN-based LEDs made from GaN, InGaN, AlGaN and AlInGaN, have relatively low reflectivity to externally incident light.

One reason for the low reflectivity of most LEDS is the high optical absorption of the LED semiconductor layers at the emitting wavelength of the internally generated light. Due to problems fabricating thin layers of the semiconductor materials, absorption coefficients greater than 50 cm$^{-1}$ are typical.

A second reason for the low reflectivity of many present LEDs is that the LED die may include a bottom electrode that has relatively poor reflectivity. For example, the bottom electrode may be constructed from a gold-nickel alloy that has worse reflectivity than, for example, aluminum or silver.

A third reason for the low reflectivity of many present LED designs is that the LED die may include a substrate that absorbs a significant amount of light. For example, GaN-based LEDs with a silicon carbide substrate are usually poor light reflectors with an overall reflectivity of less than 40%.

A fourth reason for the low reflectivity of many present LED designs is that the external structures on the LEDs, including the top metal electrodes, metal wire bonds and sub-mounts to which the LEDs are attached, are not designed for high reflectivity. For example, the top metal electrodes and wire bonds on many LEDs contain materials such as gold that have relatively poor reflectivity for light wavelengths less than about 550 nanometers. Reflectivity numbers on the order of 35% in the blue region of the optical spectrum are common for gold electrodes.

Due to the low reflectivity (less than 40%, for example) of many commercially available LEDs, illumination systems that incorporate such LEDs are designed to allow little or no light to return to the LEDs. Any light that is directed toward a poorly reflecting LED may be absorbed and lower the overall efficiency of the illumination system.

There are a few types of LEDs that have relatively high reflectivity, but such LEDs generally have low light extraction efficiency (for example, less than 25%). Illumination systems designed with such LEDs have low overall efficiency due to the low extraction efficiency of light from the LED structure.

It is possible to construct LEDs that have both high reflectivity to externally incident light and high light extraction efficiency. Examples of highly reflective, high efficiency LEDs are disclosed by Beeson and Zimmerman in U.S. patent application Ser. No. 10/952,112 entitled "LIGHT EMITTING DIODES EXHIBITING BOTH HIGH REFLECTIVITY AND HIGH LIGHT EXTRACTION" and in U.S. patent application Ser. No. 11/185,996 entitled "LIGHT EMITTING DIODES WITH IMPROVED LIGHT EXTRACTION AND REFLECTIVITY," both of which are herein incorporated by reference. LEDs are disclosed that do not require a large transparent optical element such as a hemispherical lens in order to achieve relatively high light extraction. Using such LEDs can allow illumination systems to be designed such that light is recycled back to the LED structures and is reflected by the LED structures. Light that is reflected by the LED sources will increase the effective brightness of the LED sources and increase the output brightness and efficiency of the illumination system. If both the reflectivity of the LEDs to externally incident light and the light extraction efficiency of the LEDs are high, a high efficiency, light recycling illumination system can be constructed.

LEDs with side emitting lenses are disclosed in U.S. Pat. No. 6,679,621. A complex lens having a curved reflective surface and curved and oblique angled refracting surfaces will reflect and refract light from an LED at an approximately right angle. However, the typical height of the side-emitting complex lens is 6 mm or larger. This relatively large size prevents the use of the side emitting lens devices in, for example, ultra-thin liquid crystal display (LCD) backlight structures that are thinner than about 6 mm. In order to produce ultra-thin illumination systems, it would be desirable to shorten or eliminate the lens but still retain high light extraction efficiency. U.S. Pat. No. 6,679,621 does not disclose low profile illumination systems that are thinner than about 6 mm and does not disclose recycling of emitted light back to the LEDs in order to increase the effective brightness of the LEDs and to increase the output brightness and efficiency of the illumination system.

Low profile illumination systems incorporating LEDs are disclosed in U.S. Pat. No. 6,473,554. Light exits the LED into a cusp-shaped reflector, is reflected approximately at right angles and then exits the reflector approximately parallel to the output surface of the LED. U.S. Pat. No. 6,473,554 does not disclose recycling of emitted light back to the LEDs in order to increase the effective brightness of the LEDs and to increase the output brightness and efficiency of the illumination system.

It would be desirable to develop side-emitting LED-based illumination systems that include a side emitting lens, that have a thin profile and that allow for light to be recycled back to light-reflecting LED sources. Such light recycling back to light-reflecting sources will increase the effective brightness of the LED sources and increase the output brightness and efficiency of the illumination systems. For side-emitting illumination systems that incorporate multiple LEDs having multiple colors or that incorporate wavelength conversion materials such as phosphors, it would also be desirable to utilize light recycling in order to improve color mixing and to improve the color uniformity of the output light. Such side-emitting illumination systems can be used in applications such as LCD backlights that require a high-brightness, low profile illumination source.

SUMMARY OF THE INVENTION

One embodiment of this invention is an illumination system that is comprised of a light emitting diode and a side-emitting light-recycling lens.

The light emitting diode is comprised of a first doped semiconductor layer having an output surface, a second doped semiconductor layer, an active region interposed between the first doped semiconductor layer and the second doped semiconductor layer wherein the active region has electrical contact with both the first doped semiconductor layer and the second doped semiconductor layer, a first reflecting electrode in electrical contact with the first doped semiconductor layer and a second reflecting electrode in electrical contact with the second doped semiconductor layer. The first doped semiconductor layer and the second doped semiconductor layer have opposite n and p conductivity types. The active region of the light emitting diode emits internally generated light through the output surface of the first doped semiconductor layer when a voltage is applied between the first reflecting electrode and the second reflecting electrode.

The side-emitting, light-recycling lens is comprised of a bottom reflecting surface, a center reflector proximal to the light emitting diode, a top surface distal from the light emitting diode, a first inner refracting surface and a second outer refracting surface. The bottom reflecting surface has a first edge proximal to the light emitting diode and a second edge distal from the light emitting diode. The center reflector is opposite the output surface of the light emitting diode, is separated from the output surface of the light emitting diode and has a third edge. The top surface has a fourth edge. The first inner refracting surface extends from the first edge of the bottom reflecting surface to the third edge of the center reflector. Preferably the first inner refracting surface is substantially perpendicular to the bottom reflecting surface. The second outer refracting surface extends from the second edge of the bottom reflecting surface to the fourth edge of the top surface. The lens can have 2-fold or 4-fold symmetry. The second refractive surface can be curved, faceted or frusto-conical.

The internally generated light emitted through the output surface is directed to the center reflector or is directed through the first inner refracting surface. Internally generated light that is reflected by the center reflector is redirected through the first inner refracting surface or is recycled back to the light emitting diode as externally incident light. A portion of the externally incident light recycled back to the light emitting diode is reflected by the first reflecting electrode and the second reflecting electrode of the light emitting diode, thereby increasing the effective brightness of the light emitting diode. A first fraction of the internally generated light and the reflected externally incident light is directed through the first refractive surface, is transmitted through the lens, is subsequently directed through the second refractive surface and exits the side-emitting light-recycling lens. A second fraction of the internally generated light and the reflected externally incident light is directed through the first refractive surface, is transmitted through the lens, is directed to the bottom reflecting surface, is reflected by the bottom reflecting surface, is transmitted through the lens, is directed through the second refractive surface and exits the side-emitting light-recycling lens. The recycled externally incident that is reflected by the light emitting diode and that subsequently exits the side-emitting light-recycling lens adds to the internally generated light concurrently exiting the side-emitting light-recycling lens, thereby increasing the output brightness and efficiency of the illumination system. The light emitting diode reflects externally incident light with a reflectivity greater than 40 percent.

In another embodiment of this invention, the light emitting diode is a plurality of light emitting diodes. The plurality of light emitting diodes may emit more than one color of light.

Another embodiment of this invention includes a wavelength conversion layer. The wavelength conversion layer converts a portion of the internally generated light of a first color into light of a second color, different than the first color.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein:

FIG. 1A is a top plan view of an illumination system of this invention. FIG. 1B is a cross-sectional side view along the I-I plane of the illumination system illustrated in FIG. 1A. FIG. 1C is a cross-sectional side view along the I-I plane of the illumination system illustrated in FIG. 1A showing an expanded cross-sectional view of the LED. FIGS. 1D-1I are cross-sectional side views along the I-I plane of the illumination system shown in FIG. 1A and illustrate example light rays emitted by the LED.

DETAILED DESCRIPTION OF THE PREFERRED EMBODIMENTS

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention. The above listed figures are not drawn to scale. In particular, the thickness dimension of the LEDs is expanded to better illustrate the various internal layers of the devices.

Figure 1A:
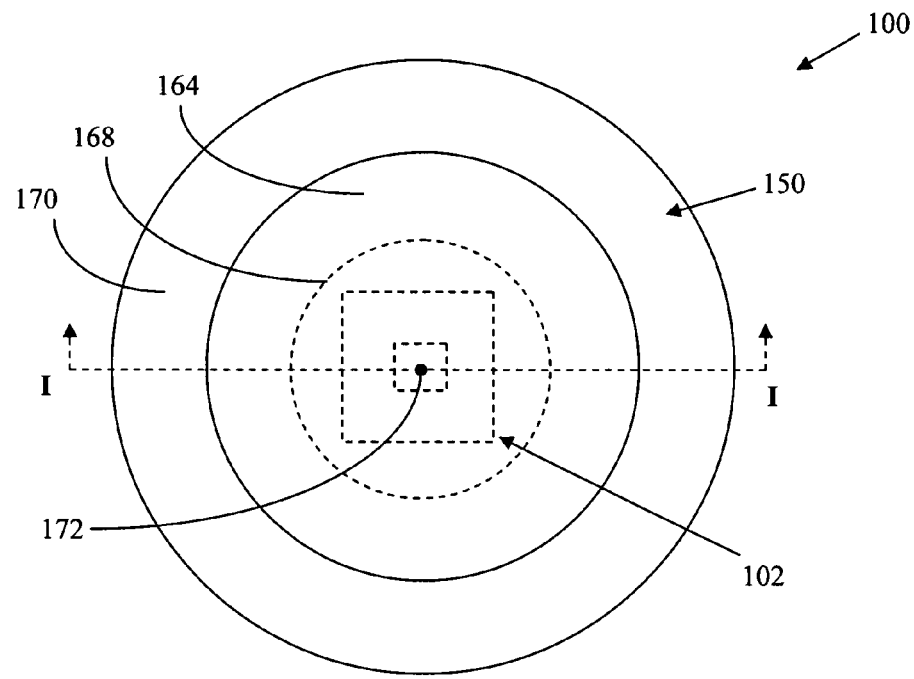
FIGS. 1A-1I are illustrations of one embodiment of an illumination system of this invention.
Figure 1B:
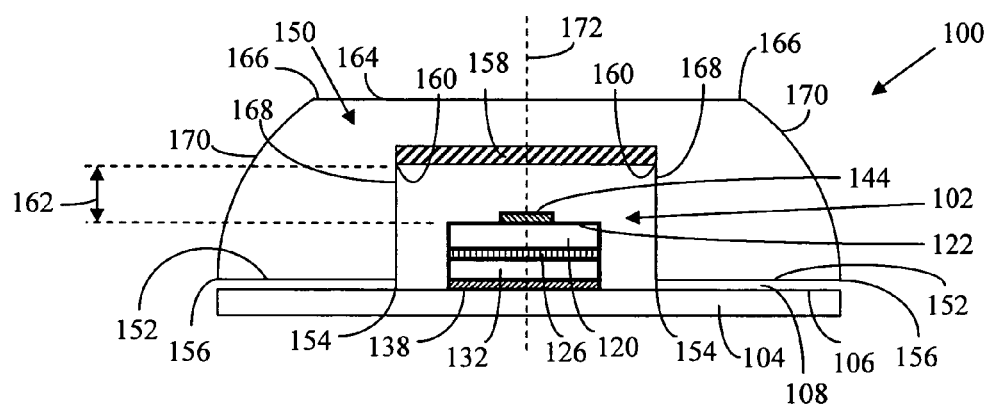
Figure 1C:
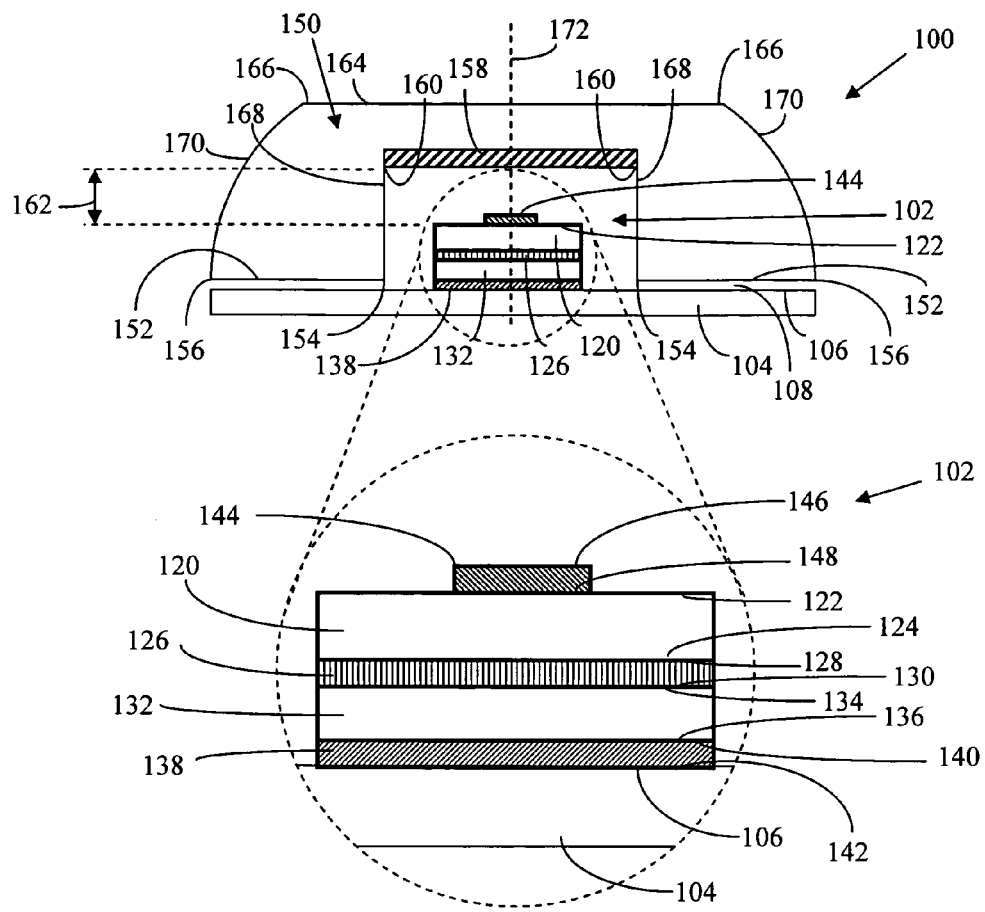

One embodiment of this invention is illustrated in FIGS. 1A-1I. FIG. 1A is a top plan view of illumination system 100. FIG. 1B is a cross-sectional view along the I-I plan of the illumination system 100 illustrated in FIG. 1A. FIG. 1C is a cross-sectional view along the I-I plane of the illumination system 100 showing an expanded cross-sectional view of LED 102. FIGS. 1D-1I are cross-sectional views along the I-I plane of the illumination system 100 shown in FIG. 1A and illustrate example light rays emitted by LED 102.

Illumination system 100 is comprised of a LED 102 and a side-emitting light recycling lens 150.

In general, LED 102 includes a first reflecting electrode 144, a first doped semiconductor layer 120, an active region 126, a second doped semiconductor layer 132 and a second reflecting electrode 138. The first doped semiconductor layer 120 and the second doped semiconductor layer 132 have opposite n and p conductivity types. For example, if the first doped semiconductor layer 120 is an n-doped layer, then the second doped semiconductor layer 132 is a p-doped layer. Conversely, if the first doped semiconductor layer 120 is a p-doped layer, then the second doped semiconductor layer 132 is an n-doped layer.

The active region 126 is interposed between the first doped semiconductor layer 120 and the second doped semiconductor layer 132. The active region 126 is in electrical contact with both the first doped semiconductor layer 120 and the second doped semiconductor layer 132. The active region 126 of LED 102 is, for example, a p-n homojunction, a p-n heterojunction, a double heterojunction, a single quantum well or a multiple quantum well of the appropriate semiconductor material for the LED 102.

The first reflecting electrode 144 is in electrical contact with the first doped semiconductor layer 120. The second reflecting electrode 138 is in electrical contact with the second doped semiconductor layer 132. When a voltage is applied by electrical connections (not shown) between the first reflecting electrode 144 and the second reflecting electrode 138, the active region 126 of LED 102 emits internally generated light. The internally generated light exits LED 102 through the top surface 122 of LED 102.

The first reflecting electrode 144 and the second reflecting electrode 138 of LED 102 may be fabricated from reflecting metals or partially transparent conducting oxides. For example, the first reflecting electrode 144 and the second reflecting electrode 138 may be formed from one or more metals or metal alloys containing, but not limited to, silver, aluminum, nickel, titanium, chromium, platinum, palladium, rhodium, rhenium, ruthenium and tungsten. In addition, the first reflecting electrode may also be fabricated from partially transparent conducting oxides such as indium tin oxide. If the first reflecting electrode is fabricated from a partially transparent conductive oxide, the electrode is only partially reflective.

In this specification, the first reflecting electrode 144 and the second reflecting electrode 138 are shown to be on opposite sides of LED 102. However, it is within the scope of this invention that the first reflecting electrode may be placed at other locations as long as it is in electrical contact with the first doped semiconductor layer 120. For example, as is well known by those skilled in the art, modifying the structure of LED 102 can allow both the first reflecting electrode and the second reflecting electrode to be located on the same side of LED 102.

LED 102 can be fabricated from GaN-based semiconductor materials containing gallium nitride (GaN), aluminum gallium nitride (AlGaN), indium gallium nitride (InGaN) and aluminum indium gallium nitride (AlInGaN). Other appropriate LED materials include, for example, aluminum nitride (AlN), boron nitride (BN), indium nitride (InN), aluminum gallium indium phosphide (AlGaInP), gallium arsenide (GaAs), indium gallium arsenide (InGaAs), indium gallium arsenide phosphide (InGaAsP), diamond or zinc oxide (ZnO), for example, but are not limited to such materials. Especially relevant LEDs for this invention are GaN-based LEDs that emit light in the ultraviolet, blue, cyan and green region of the optical spectrum and AlGaInP LEDs that emit light in the yellow and red regions of the optical spectrum. Also very relevant are LED material systems that exhibit low absorption throughout a substantial portion of their emission range. Examples of the latter materials include, but are not limited to, ZnO, BN, AlN and diamond, all of which have low absorption throughout the visible spectrum and have shorter wavelength emission spectra. The shorter wavelength emission can lead to improvements in wavelength conversion efficiency when used in conjunction with wavelength conversion materials such as phosphors.

As noted above, LED 102 may be fabricated from any suitable light-emitting semiconductor material such as the materials listed above. To better illustrate the embodiments of this invention, LED 102 is assumed for purposes of illustration to be a flip-chip, GaN-based LED having a top first reflecting electrode 144 and a bottom second reflecting electrode 138. It should be noted, however, that a flip-chip structure is not required.

To briefly summarize the important fabrication steps for this flip-chip, GaN-based, illustrative example, a first doped semiconductor layer is fabricated on a growth substrate such as sapphire. An active region is fabricated on the first doped semiconductor layer. A second doped semiconductor layer is fabricated on the active region. A second reflecting electrode is deposited onto the second doped semiconductor layer opposite the growth substrate, followed by the attachment of a sub-mount or base to the second reflecting electrode. The structure is inverted (flipped) and a liftoff process removes the growth substrate, exposing the surface of the first doped semiconductor layer that was originally attached to the growth substrate. Finally, a first reflecting electrode is deposited and patterned on the exposed surface of the first doped semiconductor layer opposite the second reflecting electrode.

The structure and fabrication of the illustrative example LED 100 shown in FIGS. 1A-1H will now be described in greater detail. See FIG. 1C for an expanded illustration of the structure of LED 102.

In this illustrative example, the first doped semiconductor layer 120 is an n-doped GaN layer, which is epitaxially deposited or otherwise conventionally fabricated on a sapphire growth substrate (not shown). The n-doped GaN semiconductor layer 120 has a first or upper surface 122 and a second or lower surface 124, opposite the first surface 122.

The active region 126 is a GaN-based multiple quantum well structure, which is epitaxially deposited or otherwise conventionally fabricated on the first doped semiconductor layer 120. The GaN-based multiple quantum well active region 126 has a first or upper surface 128, deposited or fabricated on the second surface 124 of the first doped semiconductor layer 120, and a second or lower surface 130, opposite the first surface 128. The active region 126 emits internally generated light in an emitting wavelength range when a voltage is applied across the first reflecting electrode 144 and the second reflecting electrode 138. The emitting wavelength range can include any optical wavelength. For an LED having a multiple quantum well active region 126, the emitting wavelength range typically has a full width of approximately 20 nm at the half-maximum points of the wavelength range. For visual and display applications, preferably the emitting wavelength range is between about 400 nm and about 700 nm.

The second doped semiconductor layer 132 is a p-doped GaN layer, which is epitaxially deposited or otherwise conventionally fabricated on the active region 126. The p-doped GaN semiconductor layer has a first or upper surface 134, epitaxially deposited or otherwise fabricated on the second surface 130 of the active region 126, and a second or lower surface 136, opposite the first surface 134.

The second reflecting electrode 138 of LED 102 is silver and is deposited or otherwise conventionally fabricated on the second doped semiconductor layer 132 by standard means such as evaporation or sputtering. The second reflecting electrode 138 has a first, upper and inner surface 140 fabricated on the second surface 136 of the second doped semiconductor layer, and a second or lower surface 142, opposite the first surface 140.

The upper surface 140 of the second reflecting electrode 138 is a reflecting surface for both internally generated light emitted by the active region 126 and externally incident light directed to LED 102.

After the second reflecting electrode 138 is formed on the second doped semiconductor layer 132, a sub-mount or base (such as base 104) is attached to the second reflecting electrode 138. A laser liftoff process utilizing an excimer laser removes the original sapphire substrate (not shown), exposing surface 122 of the first doped semiconductor layer 120.

The first reflecting electrode 144 is aluminum, which is deposited or otherwise conventionally fabricated on the first doped semiconductor layer 120. The first reflecting electrode 144 has a first, outer or upper surface 146, and a second, inner or lower surface 148 deposited or fabricated on the first surface 122 of the first doped semiconductor layer 120. The second surface 148 is opposite the first surface 146.

The inner surface 148 of the first reflecting electrode 144 is an inner reflecting surface for the first doped semiconductor layer 120 of LED 102. The outer surface 146 of the first reflecting electrode 144 is an outer reflecting surface for externally incident light directed to LED 102.

The first reflecting electrode 144 only partially covers the surface 122 of the first doped semiconductor layer 120. Portions of the surface 122 of the first doped semiconductor layer 120, not covered by the first reflecting electrode 144, are exposed and those exposed portions of the surface 122 of the first doped semiconductor layer 120 are an output or exit surface for the light emitted by the LED 102.

The reflectivity of LED 102 to externally incident light depends on several factors. These factors include the reflectivity of the first reflecting electrode 144 and the reflectivity of the second reflecting electrode 138. Increasing the reflectivity of the first reflecting electrode 144 and/or the second reflecting electrode 138 will increase the reflectivity of LED 102 to externally incident light.

A common electrode material for the outer surface 146 of the first reflecting electrode in prior art light emitting devices is gold. Gold has very good electrical properties, but is a poor optical reflector for visible light in the range of 400 nm to 550 nm. For LEDs that emit light in the 400-550 nm range or thereabouts, it is advantageous to replace gold with a more reflective material. In order to improve the reflectivity of LED 102 to externally incident light, preferably the first reflecting electrode 144 has a reflectivity greater than 60 percent in the emitting wavelength range. More preferably, the first reflecting electrode 144 has a reflectivity greater than 80 percent in the emitting wavelength range. Suitable materials for the first reflecting electrode that have a reflectivity greater than 80 percent include aluminum and silver. In the illustrative example for LED 102, the first reflecting electrode is fabricated from aluminum.

The second reflecting electrode 138 covers a larger surface area than the first reflecting electrode 144. Consequently, the reflectivity of the second reflecting electrode is more critical than the reflectivity of the first metal electrode. In order to improve the reflectivity of LED 102 to externally incident light, preferably the reflectivity of the second reflecting electrode 138 is greater than 92 percent in the emitting wavelength range. More preferably the reflectivity of the second reflecting electrode is greater than 96 percent in the emitting wavelength range. Most preferably, the reflectivity of the second reflecting electrode is greater than 98 percent in the emitting wavelength range. A suitable material for the second reflecting electrode that has a reflectivity greater than 98 percent is silver. In the illustrative example for LED 102, the second reflecting electrode 138 is fabricated from silver.

Other factors that affect the overall reflectivity of LED 102 include the absorption coefficients of the LED structure, including the absorption coefficients of the first doped semiconductor layer 120, the active region 126 and the second doped semiconductor layer 132. The absorption coefficients of these layers are important since any externally incident light that is reflected by the second reflecting electrode 138 must pass through these layers. By lowering the absorption coefficients of the first doped semiconductor layer 120, the active region 126 and/or the second doped semiconductor layer 132, the reflectivity of LED 102 to externally incident light will increase.

Usually, the absorption coefficients of the first doped semiconductor layer 120, the active region 126 and the second doped semiconductor layer 132 in LED 102 are not the same. If the different semiconductor layers that make up LED 102 have different absorption coefficients, the absorption coefficient for LED 102 is defined in this specification as the thickness-weighted-average absorption coefficient for all the semiconductor layers. The weighting function is the fractional thickness of each semiconductor layer in LED 102. In order to improve the reflectivity of LED 102 to externally incident light, preferably the absorption coefficient (i.e. the thickness-weighted average absorption coefficient) of the semiconductor layers in LED 102 in the emitting wavelength range of the internally generated light is less than 50 $cm^{-1}$.

In prior art GaN-based LEDs, the absorption coefficient of the semiconductor layers in the emitting wavelength range is generally greater than 50 $cm^{-1}$. In order to minimize the absorption coefficient of a LED, the absorption coefficient for each semiconductor layer of the LED must be minimized. This can be accomplished by improving the deposition processes for the different semiconductor layers in order to reduce impurities or defects and to improve the crystalline structure of the layers. For example, hydride vapor phase epitaxy (HVPE) can be used to epitaxially grow the first doped semiconductor layer and the second doped semiconductor layer. HVPE does not have the carbon impurities that can be present in the metal-organic chemical vapor deposition (MOCVD) processes normally used in GaN LED fabrication. Alternatively, if MOCVD is used to deposit the semiconductor layers, a higher deposition temperature can be used to reduce carbon impurities and crystalline defects in the layers. Other alternate processes that lead to improved GaN crystal quality include molecular beam epitaxy (MBE) and high-pressure high-temperature (HPHT) crystal growth.

The overall reflectivity of LED 102 to externally incident light depends on the factors described above. In order to improve the efficiency and output brightness of illumination system 100, preferably the reflectivity of LED 102 to externally incident light is greater than 40 percent. More preferably, the reflectivity of LED 102 to externally incident light is greater than 50 percent. Most preferably, the reflectivity of LED 102 to externally incident light is greater than 60 percent.

It is well known by those skilled in the art that LED 102 may include additional layers in order to adjust and improve the operation of the LED 102. For example, a current spreading layer may be inserted between the lower surface 148 of the first reflecting electrode 144 and the upper surface 122 of the first doped semiconductor layer 120. Such a current spreading layer will have the same conductivity type as the first doped semiconductor layer and will improve the uniformity of current injection across the entire active region. In addition, a current spreading layer may be inserted between the lower surface 136 of the second doped semiconductor layer and the upper surface 140 of the second reflecting electrode 138. The latter current spreading layer will have the same conductivity type as the second doped semiconductor layer. As another example, an electron blocking layer may inserted either between the lower surface 124 of the first doped semiconductor layer 120 and the upper surface 128 of the active region 126 or between the lower surface 130 of the active region 126 and the upper surface 134 of the second doped semiconductor layer 132. The electron blocking layer reduces the escape of electrons from the active region. If the current spreading layers or the electron blocking layers absorb part of the light passing through the layers, the reflectivity of LED 102 to externally incident light will be reduced. In order to minimize these effects, the absorption coefficients and thicknesses of any current spreading layers and/or electron blocking layers are preferably minimized.

Although illumination system 100 is illustrated in FIGS. 1A-1I as having a single LED 102 associated a side-emitting light recycling lens 150, it is also within the scope of this invention that illumination system 100 can have more than one LED associated with one side-emitting light-recycling lens. For example, there may be two or more LEDs associated with a single side-emitting light-recycling lens. The two or more LEDs may emit a single color of light or the two or more LEDs may emit more than one color of light. For example, two LEDs may emit one color of light or two colors of light, three LEDs may emit one color of light, two colors of light or three colors of light and so forth.

Details will now be presented about the other elements of the illumination system 100.

The illumination system 100 also includes a base 104 that has a top surface 106. The bottom surface 142 of LED 102, which is also the bottom surface of the second reflecting electrode 138, is attached to top surface 106 of base 104. Preferably the top surface 106 of base 104 is a reflective surface. The top surface 106 may be a diffuse reflector, a specular reflector or a diffuse reflector backed by a specular reflector. In order to supply electrical current to the second reflecting electrode 138, preferably the base 104 is electrically conductive. If base 104 is not electrically conductive, a separate electrical connection (not shown) is needed to supply electrical current to the second reflecting electrode 138.

The side-emitting light-recycling lens 150 is comprised of a bottom reflecting surface 152, a center reflector 158, a top surface 164, a first inner refracting surface 168 and a second outer refracting surface 170.

The side-emitting light-recycling lens 150 may have an axis of symmetry or a plane of symmetry, but such an axis of symmetry or plane of symmetry is not required. If the side-emitting light-recycling lens has an axis of symmetry, the symmetry may be cylindrical symmetry or the symmetry may be N-fold symmetry, where N is an integer equal to or greater than 2. As shown in FIGS. 1A-1B, the side-emitting light recycling lens 150 has an axis of symmetry 172 and the side-emitting light-recycling lens 150 is cylindrically symmetric.

The bottom reflecting surface 152 has a first edge 154 proximal to the light emitting diode 102. The first edge 154 forms a central hole surrounding the light emitting diode 102. The bottom reflecting surface 152 also has a second edge 156 distal from the light emitting diode 102.

The bottom reflecting surface 152 may be separated from the top surface 106 of base 104 by gap 108 as shown in FIGS. 1A-1I or the bottom reflecting surface 152 may be attached to the top surface 106 of base 104 (not shown). For example, if the bottom reflecting surface 152 is separated from the top surface 106 of base 104 by a gap 108, the gap may be filled with air, an inert gas or a vacuum. Alternatively the gap 108 may be filled with a transparent material that has a lower refractive index than the refractive index of the side-emitting light-recycling lens 150. This allows total internal reflection to occur for light directed to the bottom reflecting surface 152 at high angles. Appropriate low index materials include, but are not limited to, polymer materials such as silicones or fluoroacrylates. As another alternative, small standoff structures may be placed in the gap 108 to attach the bottom reflecting surface 152 to the top surface 106 of base 104. The portion of the area of the bottom reflecting surface 152 occupied by the standoff structures should be small so that total internal reflection can occur over most of the bottom reflecting surface 152. If a large portion of the bottom reflecting surface 152 is attached to the top surface 106 of base 104, then a specular reflective coating will be required on the bottom reflecting surface 152 or on the top surface 106 that is in contact with the bottom reflecting surface 152 in order for light to reflect from the bottom reflecting surface 152.

The bottom reflecting surface 152 may be a planar surface or a non-planar surface. Preferably the bottom reflecting surface 152 is a planar surface that is perpendicular to the axis of symmetry 172.

The shapes of the first edge 154 and the second edge 156 of the bottom reflecting surface 152 may be curved or faceted. Example curved shapes include, but are not limited to, a circle, an ellipse or an irregular curve. Example faceted shapes include, but are not limited to, a square, a rectangle, a polygon or an irregular faceted shape. In FIGS. 1A-1I, the first edge 154 and the second edge 156 have a circular shape.

The bottom reflecting surface 152 is preferably a specular reflector. If the bottom reflecting surface 152 is separated from the top surface 106 of base 104 by gap 108, then the bottom reflecting surface may be fabricated from a specular reflective material or the bottom reflecting surface may reflect light by total internal reflection. If gap 108 is present, preferably the bottom reflecting surface reflects light by total internal reflection.

If the bottom reflecting surface 152 is attached to the top surface 106 of base 104 and the top surface 106 is a specular reflector, then the bottom reflecting surface 152 needs no additional reflective coating. The bottom reflective surface 152 will coincide with the top surface 106 of base 104 and light directed to the bottom reflecting surface 152 will be reflected by the top surface 106 of base 104. The top surface 106 of base 104 acts as a reflective coating for the bottom reflecting surface 152.

If the bottom reflecting surface 152 is attached to the top surface 106 of base 104 and the top surface 106 is a diffuse reflector, then the bottom reflecting surface 152 will require a separate specular reflective coating so that light will be reflected by the specular reflective coating and will not be reflected by the diffuse reflector of base 104 underlying the bottom reflecting surface 152.

The center reflector 158 is proximal to LED 102 and is opposite the output surface 122 of LED 102. The center reflector 158 has a third edge 160. The center reflector is separated from the output surface 122 by separation distance 162. The center reflector 158 may be a planar reflector or the center reflector 158 may be non-planar. For example, a non-planar center reflector may have the shape of an inverted peak or have the shape of a convex curved surface. Examples of inverted peaks include an inverted cone or an inverted prism. In FIGS. 1A-1I, the center reflector 158 is a planar reflector. If center reflector 158 is a planar reflector, then preferably the separation distance 162 is less than 4 millimeters. More preferably, the separation distance 162 is less than 2 millimeters.

The shape of the third edge 160 of center reflector 158 may be curved or faceted. Example curved shapes include, but are not limited to, a circle, an ellipse or an irregular curve. Example faceted shapes include, but are not limited to, a square, a rectangle, a polygon or an irregular faceted shape. Preferably the third edge 160 of center reflector 158 has the same shape as the first edge 154 of the bottom reflecting surface 152. In FIGS. 1A-1I, the third edge 160 of center reflector 158 and the first edge 154 of the bottom reflecting surface 152 both have circular shapes.

The top surface 164 is distal from the output surface 122 of LED 102. The top surface 164 has a fourth edge 166. The shape of the top surface 164 is not critical. For example, the top surface 164 may be planar or non-planar. If the top surface 164 is non-planar, the non-planar surface may be convex, concave or faceted. Preferably the top surface 164 is planar to allow sufficient structural support for the side-emitting light-recycling lens 150 as well as to minimize the thickness of the side-emitting light-recycling lens. Minimization of the lens thickness is helpful if the illumination system is used in low profile applications such as backlights for LCDs.

The fourth edge 166 of top surface 164 may be curved or faceted. Example curved shapes include, but are not limited to, a circle, an ellipse or an irregular curve. Example faceted shapes include, but are not limited to, a square, a rectangle, a polygon or an irregular faceted shape. In FIGS. 1A-1I, the fourth edge 166 has the shape of a circle. Preferably the fourth edge 166 of top surface 164 has the same shape as the second edge 156 of the bottom reflecting surface 152. Preferably the area enclosed by the fourth edge 166 of top surface 164 is less than the area enclosed by the second edge 156 of the bottom reflecting surface 152.

The first inner refracting surface 168 extends from the first edge 154 of the bottom reflecting surface 152 to the third edge 160 of the center reflector 158. Preferably the first inner refracting surface 168 is substantially perpendicular to the bottom reflecting surface 152, although it is not required that first inner refracting surface 168 be substantially perpendicular. In FIGS. 1B-1I, the first inner refracting surface is perpendicular to the bottom reflecting surface.

The shape of the first inner refracting surface 168 depends partly on the shape of the first edge 154 of the bottom reflecting surface 152 and the shape of the third edge 160 of the center reflector 158. The shape of the first inner refracting surface 168 also depends on the curvature of the first inner refracting surface 168 in the direction parallel to axis of symmetry 172. The shape of the first inner refracting surface 168 in the direction parallel to axis of symmetry 172 may be straight, curved or faceted. Example curved surfaces include, but are not limited to, a section of a sphere, a section of a cylinder, a section of an ellipsoid, a section of a paraboloid or a section of a toroid. Example faceted surfaces include, but are not limited to, a section of a cube, a section of a rectangular solid or a section of a polygonal solid. In FIGS. 1A-1I, the shape of the first inner refracting surface 168 is cylindrical.

The second outer refracting surface 170 extends from the second edge 156 of the bottom reflecting surface 152 to the fourth edge 166 of the top surface 164. The shape of the second outer refracting surface depends partly on the shape of the second edge 156 of the bottom reflecting surface 152 and the shape of the fourth edge 166 of the top surface 164. The shape of the second outer refracting surface may be curved or faceted. Example curved surfaces include, but are not limited to, a section of a sphere, a section of a cylinder, a section of a cone (a frusto-conical shape), a section of an ellipsoid, a section of a paraboloid or a section of a toroid. Example faceted surfaces include, but are not limited to, a section of a pyramid. The pyramid may have three sides and a base or the pyramid may have more than three sides and a base. The sides of the pyramid may all have the same shape or the sides of the pyramid may have different shapes. In FIGS. 1A-1I, the shape of the second outer refracting surface 170 is a section of a sphere.

The side-emitting light-recycling lens 150 may be fabricated from any material that is transparent to the light internally generated by LED 102. Example materials include plastics, inorganic glasses an inorganic crystalline materials. Example plastics include, but are not limited to, acrylates such as polymethylmethacrylate, fluoroacrylates, polystyrene and polycarbonate. Example inorganic glasses include, but are not limited to, silica and BK7. Example inorganic crystalline materials include, but are not limited to, sapphire and calcium fluoride.

There are several types of diffuse reflecting materials that can be used for the center reflector 158 and the top surface 106 of base 104. Diffuse reflectors can be made that have very high reflectivity (for example, greater than 98%). Examples of diffuse reflectors include, but are not limited to, fluoropolymer materials such as Spectralon™ from Labsphere, Inc. and polytetrafluoroethylene film from manufacturers such as Fluorglas (sold under the trade name Furon™), W. L. Gore and Associates, Inc. (sold under the trade name DRP™), or E. I. du Pont de Nemours & Company (sold under the trade name of Teflon™), films of barium sulfate, porous polymer films containing tiny air channels such as polyethersulfone and polypropylene filter materials made by Pall Gelman Sciences, and polymer composites utilizing reflective filler materials such as, for example, titanium dioxide. A preferred diffuse reflecting material is DRP™ made by W. L. Gore and Associates, Inc. Note that the thickness of a diffuse reflector needed to achieve high reflectivity can be reduced if a specular reflector is used as a backing layer on the diffuse reflector.

If the bottom reflecting surface 152 does not utilize total internal reflection, several types of specular reflecting materials may be used for the bottom reflecting surface. The same types of materials may also be used for the top surface 106 of base 104. Most specular reflective materials have reflectivity ranging from about 80% to about 98.5%. Examples of specular reflective materials include, but are not limited to, Silverlux™, a product of 3M Corporation, and thin metallic coatings formed from materials such as silver, aluminum or gold. The thickness of the metallic coating may range from about 0.05 micrometers to about 0.1 millimeter, depending on the materials used and the method of manufacturing the metal coating. The metallic coating may be applied directly to the bottom reflecting surface 152 by standard coating processes or the metallic coating may first be applied to a thin plastic film followed by attachment of the film to the bottom reflecting surface 152. Other examples of specular reflective films that have high reflectivity include photonic bandgap reflective materials, distributed Bragg reflectors (DBRs), omni-directional reflectors (ODRs) and Vikuiti™ ESR (Enhanced Specular Reflector) made by 3M Corporation. The ESR film, for example, has a reflectivity of greater than 98% across the visible light spectrum. Preferred specular reflectors are Silverlux™ and Vikuiti™ ESR materials made by 3M Corporation, various types of ODR films and thin metallic coatings of silver or aluminum applied directly to the bottom reflecting surface 152 and/or the top surface 106 of base 104.

FIGS. 1D-1I illustrate example light rays emitted by the active region 126 of LED 102.

Figure 1D:
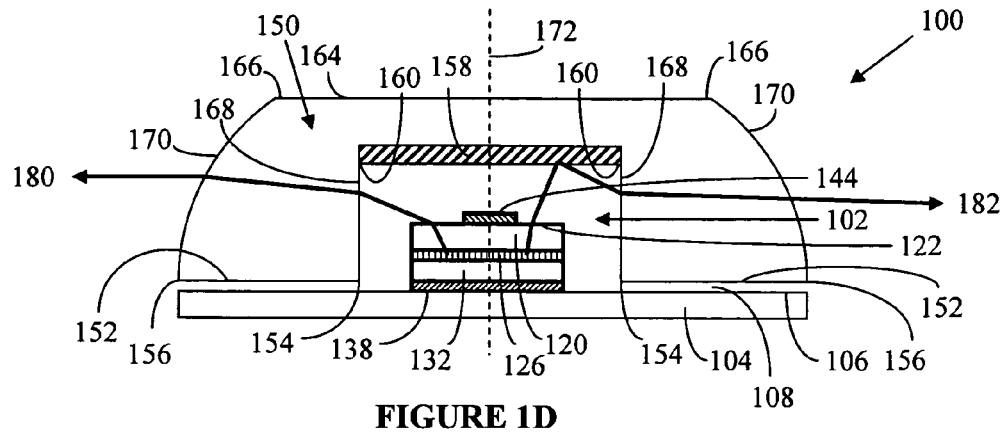

In FIG. 1D, example internally generated light ray 180 is emitted by the active region 126 and directed toward the surface 122 of LED 102. Surface 122 is both the first surface of the first doped semiconductor layer 120 and the output surface of LED 102. Internally generated light ray 180 is transmitted through output surface 122 and is directed to the first inner refracting surface 168 of side-emitting light recycling lens 150. Internally generated light ray 180 is refracted by the first inner refracting surface 168, is transmitted through the side-emitting light-recycling lens 150 and is directed to the second outer refracting surface 170. Internally generated light ray 180 is refracted by the second outer refracting surface 170 and exits illumination system 100 in a direction substantially parallel to the bottom reflecting surface 152 of the side-emitting light-recycling lens 150.

In this specification, substantially parallel to the bottom reflecting surface means that the light is directed at angles less than 30 degrees from the plane of the bottom reflecting surface 152. Expressed in a different way, substantially parallel to the bottom reflecting surface 152 means that the light is directed at angles greater than 60 degrees from a direction perpendicular to the bottom reflecting surface 152.

In FIG. 1D, example internally generated light ray 182 is emitted by the active region 126 and directed toward the surface 122 of LED 102. Internally generated light ray 182 is transmitted through output surface 122 and is directed to the top reflector 158. Internally generated light ray 182 is reflected by the top reflector 158 and is directed to the first inner refracting surface 168 of side-emitting light recycling lens 150. Internally generated light ray 182 is refracted by the first inner refracting surface 168, is transmitted through the side-emitting light-recycling lens 150 and is directed to the second outer refracting surface 170. Internally generated light ray 182 is refracted by the second outer refracting surface 170 and exits illumination system 100 in a direction substantially parallel to the bottom reflecting surface 152 of the side-emitting light-recycling lens 150.

Figure 1E:
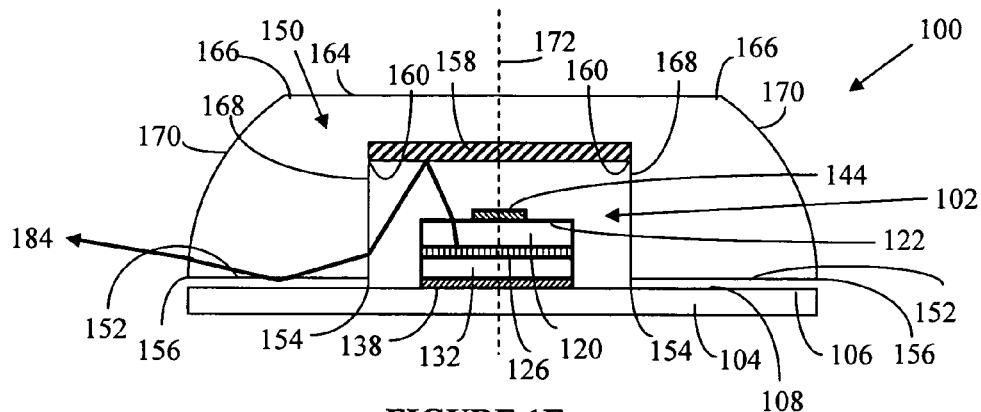

In FIG. 1E, example internally generated light ray 184 is emitted by the active region 126 and directed toward the surface 122 of LED 102. Internally generated light ray 184 is transmitted through output surface 122 and is directed to the top reflector 158. Internally generated light ray 184 is reflected by the top reflector 158 and is directed to the first inner refracting surface 168 of side-emitting light recycling lens 150. Internally generated light ray 184 is refracted by the first inner refracting surface 168, is transmitted through the side-emitting light-recycling lens 150 and is directed to the bottom reflecting surface 152. Internally generated light ray 184 undergoes total internal reflection by the bottom reflecting surface 152, is transmitted through the side-emitting light-recycling lens 150 and is directed to the second outer refracting surface 170. Internally generated light ray 184 is refracted by the second outer refracting surface 170 and exits illumination system 100 in a direction substantially parallel to the bottom reflecting surface 152 of the side-emitting light-recycling lens 150.

Figure 1F:
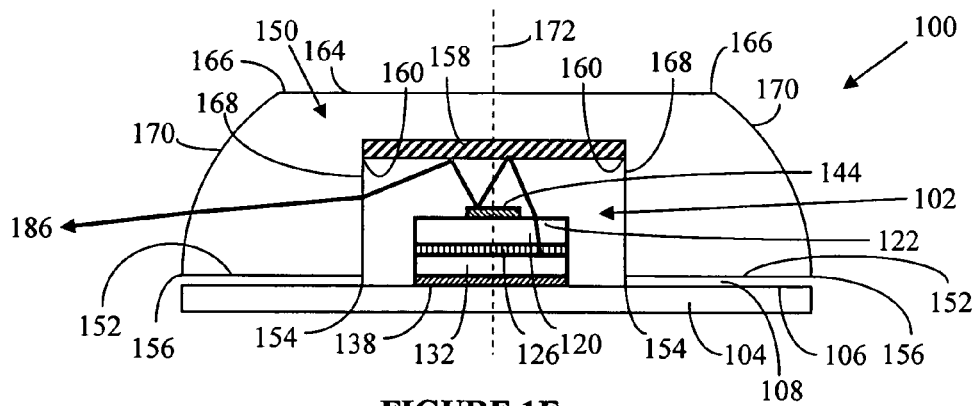
Figure 1G:
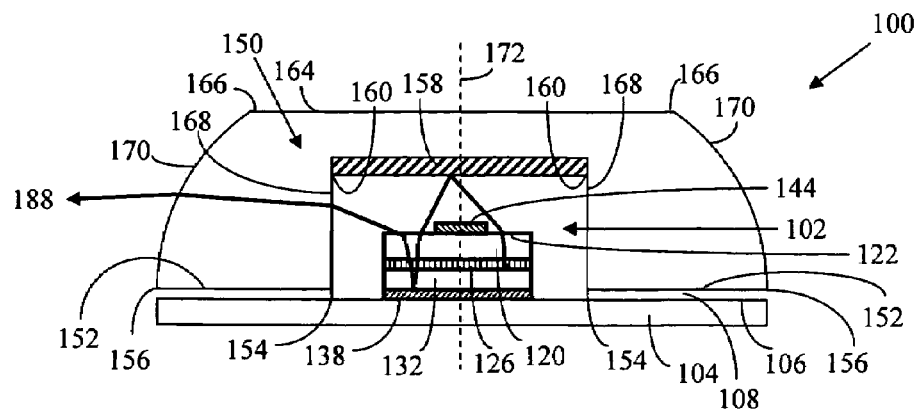
Figure 1H:
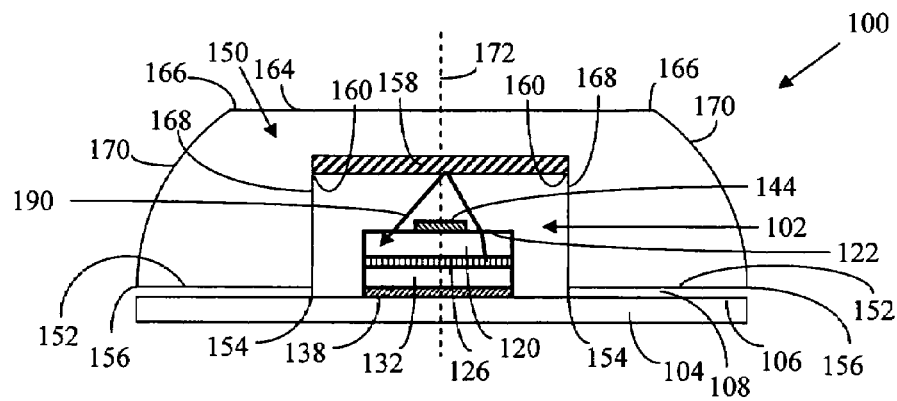

FIGS. 1F-1H illustrate example rays of internally generated light emitted by LED 102 that are recycled back to LED 102 as externally incident light.

In FIG. 1F, example light ray 186 is emitted by the active region 126 as internally generated light and is directed toward surface 122 of LED 102. Light ray 186 is transmitted through output surface 122 and is directed to the top reflector 158. Light ray 186 is reflected by the top reflector 158 and is recycled back to the first reflecting electrode 144 of LED 102 as externally incident light. Light ray 186 is reflected by the first reflecting electrode 144 and is directed to the top reflector 158 a second time. Light ray 186 is reflected by top reflector 158 a second time and is directed to the first inner refracting surface 168 of side-emitting light recycling lens 150. Light ray 186 is refracted by the first inner refracting surface 168, is transmitted through the side-emitting light-recycling lens 150 and is directed to the second outer refracting surface 170. Light ray 186 is refracted by the second outer refracting surface 170 and exits illumination system 100 in a direction substantially parallel to the bottom reflecting surface 152 of the side-emitting light-recycling lens 150. The reflection of light ray 186 by the first reflecting electrode 144 of LED 102 adds to the internally generated light (not shown in FIG. 1F) concurrently emitted by LED 102, thereby increasing the effective brightness of LED 102. The passage of recycled light ray 186 through the second outer refracting surface 170 adds to the internally generated light concurrently exiting the second outer refracting surface 170, thereby increasing the efficiency and output brightness of illumination system 100.

In FIG. 1G, example light ray 188 is emitted by the active region 126 as internally generated light and is directed toward surface 122 of LED 102. Light ray 188 is transmitted through output surface 122 and is directed to the top reflector 158. Light ray 188 is reflected by the top reflector 158 and is recycled back to the top surface 122 of LED 102 as externally incident light. Light ray 188 is transmitted by the top surface 122 a second time and is directed to the second reflecting electrode 138. Light ray 188 is reflected by the second reflecting electrode 138 and is directed to the top surface 122 of LED 102. Light ray 188 is transmitted by top surface 122 a third time and is directed to the first inner refracting surface 168 of side-emitting light recycling lens 150. Light ray 188 is refracted by the first inner refracting surface 168, is transmitted through the side-emitting light-recycling lens 150 and is directed to the second outer refracting surface 170. Light ray 188 is refracted by the second outer refracting surface 170 and exits illumination system 100 in a direction substantially parallel to the bottom reflecting surface 152 of the side-emitting light-recycling lens 150. The reflection of light ray 188 by the second reflecting electrode 138 of LED 102 adds to the internally generated light (not shown in FIG. 1G) concurrently emitted by LED 102, thereby increasing the effective brightness of LED 102. The passage of recycled light ray 188 through the second outer refracting surface 170 adds to the internally generated light concurrently exiting the second outer refracting surface 170, thereby increasing the efficiency and output brightness of illumination system 100.

In FIG. 1H, example light ray 190 is emitted by the active region 126 as internally generated light and is directed toward surface 122 of LED 102. Light ray 190 is transmitted through output surface 122 and is directed to the top reflector 158. Light ray 190 is reflected by the top reflector 158 and is recycled back to the top surface 122 of LED 102 as externally incident light. Light ray 190 is transmitted by the top surface 122 a second time and is absorbed by one of the semiconductor layers in LED 102. LED 102 does not reflect all externally incident light directed to LED 102. Some externally incident light, such as light ray 158, is absorbed by LED 102.

Light ray 186 is reflected by first reflecting electrode 144 of LED 102. Light ray 188 is reflected by the second reflecting electrode 138 of LED 102. Light ray 190 is absorbed by one of the semiconductor layers of LED 102. Only a portion of the externally incident light directed to LED 102 is reflected by the first reflecting electrode 144 and the second reflecting electrode 138 of LED 102. The reflected light is subsequently redirected to the center reflector 158 or is redirected to the first inner refracting surface 168 of the side-emitting light-recycling lens 150. LED 102 may absorb the remainder of the externally incident light directed to the LED.

Light rays 180, 182, 186 and 188 are refracted by the first inner refracting surface 168, are transmitted through the side-emitting light-recycling lens 150 directly to the second outer refracting surface 170, are refracted by the second outer refracting surface and exit the illumination system 100. Light ray 184 is refracted by the first inner refracting surface 168, is transmitted through the side-emitting light-recycling lens 150, is directed to the bottom reflecting surface 152, is reflected by the bottom reflecting surface, is transmitted through the side-emitting light-recycling lens 150, is directed to the second outer refracting surface 170, is refracted by the second outer refracting surface and exits the illumination system 100. A first fraction of the light that is directed through the first inner refracting surface 168 is directed through the second outer refracting surface 170 without reflecting from the bottom reflecting surface 152. The first fraction exits the side-emitting light-recycling lens in a direction substantially parallel to the bottom reflecting surface 152. A second fraction of the light that is directed through the first inner refracting surface 168 is reflected by the bottom reflecting surface 152 before subsequently being directed though the second outer refracting surface 170. The second fraction exits the side-emitting light-recycling lens in a direction substantially parallel to the bottom reflecting surface 152.

Figure 1I:
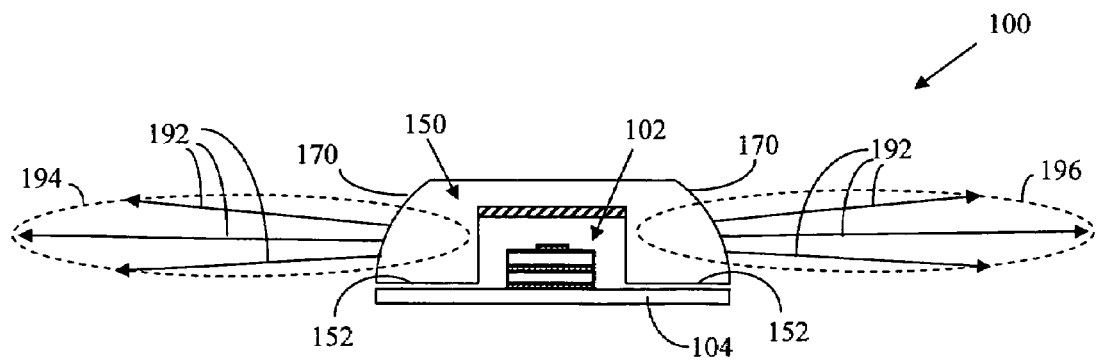

Light rays 192 in FIG. 1I schematically illustrate the light output distribution of light exiting illumination system 100. The light exits to the sides of the illumination system 100 in directions indicated by dotted lines 194 and 196. The light rays 192 are directed substantially parallel to the bottom reflecting surface 152. As stated previously, the direction substantially parallel to the bottom reflecting surface means that the light is directed at angles less than 30 degrees from the plane of the bottom reflecting surface 152.

Figure 2:
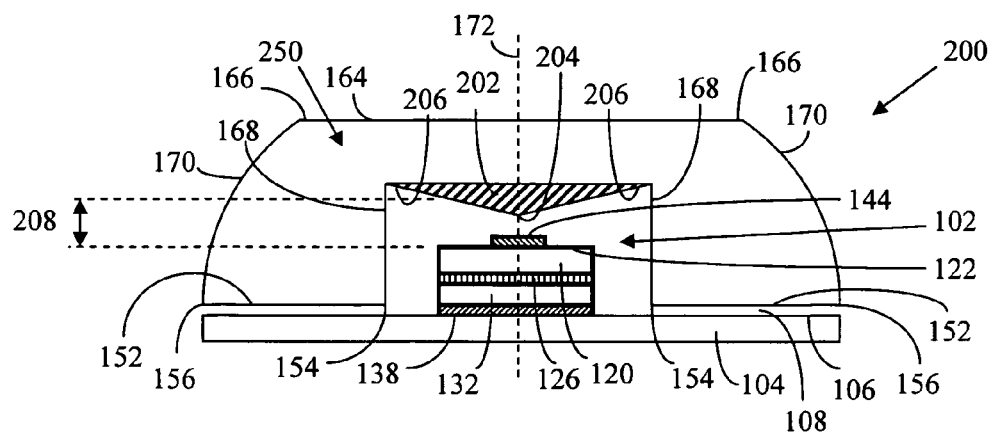
FIG. 2 is a cross-sectional side view of another embodiment of an illumination system of this invention. The top reflector of the side-emitting light-recycling lens has the shape of an inverted peak.

Another embodiment of this invention is illumination system 200, illustrated in cross-section in FIG. 2. Illumination system 200 is comprised of LED 102 and side-emitting light-recycling lens 250. LED 102 has been described previously. Side-emitting light-recycling lens 250 is comprised of a bottom reflecting surface 152, a center reflector 202, a top surface 164, a first inner refracting surface 168 and a second outer refracting surface 170. The bottom reflecting surface 152, the top surface 164, the first inner refracting surface 168 and the second outer refracting surface 170 are unchanged from illumination system 100. However, the center reflector 202 is different than the center reflector 158 in illumination system 100. Center reflector 202 is not planar. Center reflector 202 has the shape of an inverted peak, where the inverted peak is located at the center 204 of the center reflector 202. Example shapes for the center reflector 202 include, but are not limited to, an inverted cone or an inverted pyramid. In FIG. 2, the shape is an inverted cone. As shown in FIG. 2, preferably the center reflector 202 is symmetrical in shape and centered above the LED in order to redirect the light emitted by the LED to the first inner refracting surface 168. The separation distance 208 between the center reflector 202 and the output surface 122 of LED 102 increases from the center 204 of the center reflector to the edges 206 of the center reflector. The non-planar surface can reduce the number of reflections that a light ray will undergo between the center reflector 202 and LED 102 before the light ray passes through the first inner refracting surface 168. Center reflector 202 is fabricated from the same materials as center reflector 158 described previously.

Figure 3:
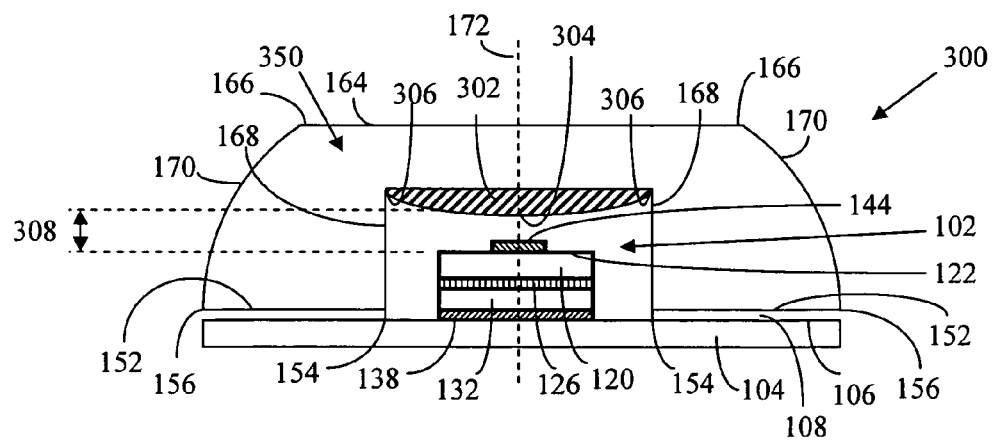
FIG. 3 is a cross-sectional side view of another embodiment of an illumination system of this invention. The top reflector of the side-emitting light-recycling lens has a curved shape.

Another embodiment of this invention is illumination system 300, illustrated in cross-section in FIG. 3. Illumination system 300 is comprised of LED 102 and side-emitting light-recycling lens 350. LED 102 has been described previously. Side-emitting light-recycling lens 350 is comprised of a bottom reflecting surface 152, a center reflector 302, a top surface 164, a first inner refracting surface 168 and a second outer refracting surface 170. The bottom reflecting surface 152, the top surface 164, the first inner refracting surface 168 and the second outer refracting surface 170 are unchanged from illumination system 100. However, the center reflector 302 is different than the center reflector 158 in illumination system 100. Center reflector 302 is not planar. Center reflector 302 has a curved surface with a center 304. Example shapes for the center reflector 202 include, but are not limited to, a portion of a sphere or a portion of an ellipsoid. In FIG. 3, the shape is a portion of an ellipsoid. As shown in FIG. 3, preferably the center reflector 302 is symmetrical in shape and centered above the LED in order to redirect the light emitted by the LED to the first inner refracting surface 168. The separation distance 308 between the center reflector 302 and the output surface 122 of LED 102 increases from the center 304 of the center reflector to the edges 306 of the center reflector. The non-planar surface can reduce the number of reflections that a light ray will undergo between the center reflector 302 and LED 102 before the light ray passes through the first inner refracting surface 168. Center reflector 302 is fabricated from the same materials as center reflector 158 described previously.

Figure 4A:
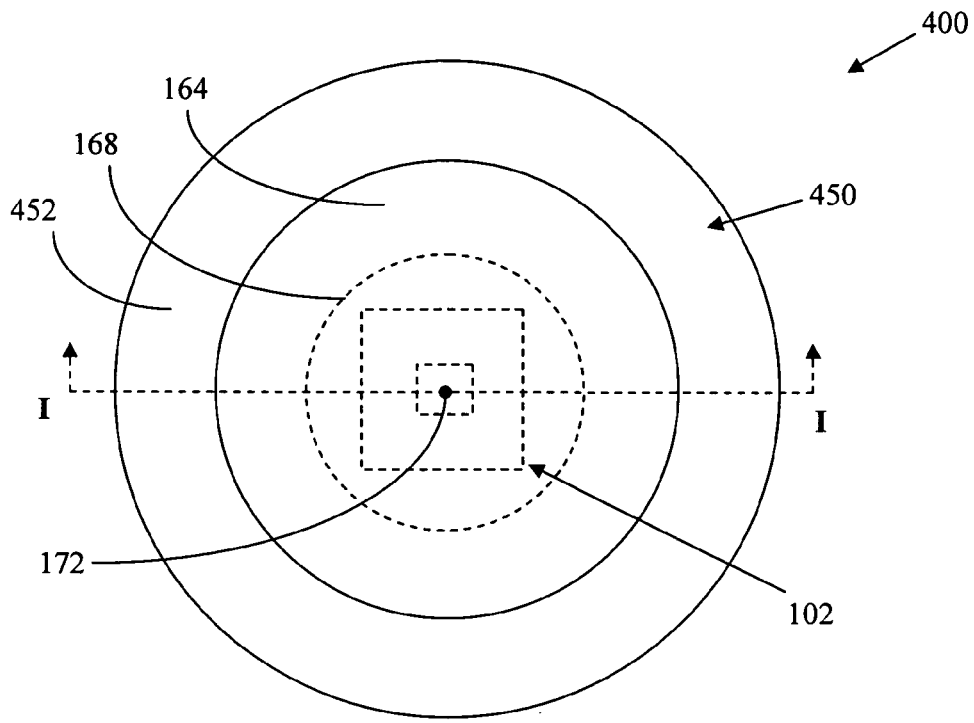
FIG. 4A is a top plan view of another embodiment of an illumination system of this invention. The second outer refracting surface of the side-emitting light-recycling lens has the shape of a section of a cone.
Figure 4B:
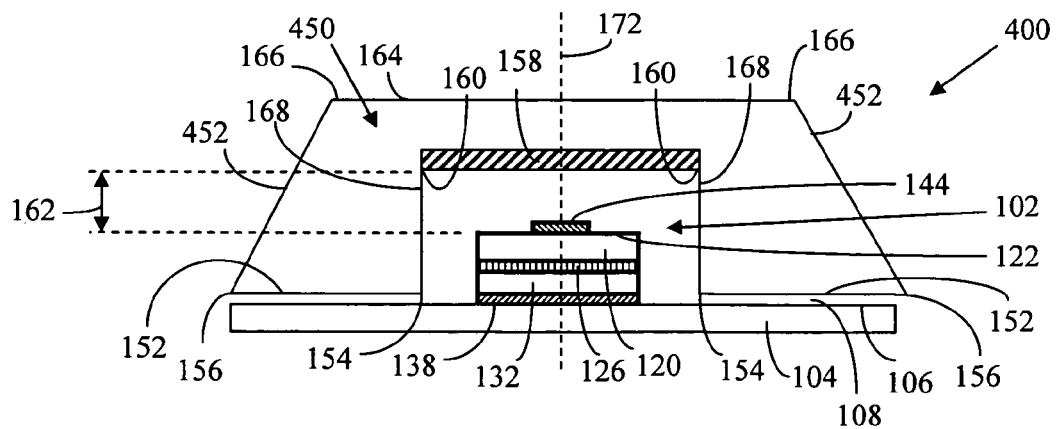
FIG. 4B is a cross-sectional side view along the I-I plane of the illumination system illustrated in FIG. 4A.

Another embodiment of this invention is illumination system 400 illustrated in plan view in FIG. 4A. A cross-sectional view along the I-I plane of the illumination system 400 shown in FIG. 4A is illustrated in FIG. 4B. Illumination system 400 is comprised of LED 102 and side-emitting light-recycling lens 450.

LED 102 has been described previously. Side-emitting light-recycling lens 450 is comprised of a bottom reflecting surface 152, a center reflector 158, a top surface 164, a first inner refracting surface 168 and a second outer refracting surface 452. The bottom reflecting surface 152, the center reflector 158, the top surface 164 and the first inner refracting surface 168 are unchanged from illumination system 100. However, the second outer refracting surface 452 is different than the second outer refracting surface 170 in illumination system 100. The second outer refracting surface 452 has a different shape than second outer refracting surface 170. The second outer refracting surface 452 of illumination system 400 has a frusto-conical shape. The frusto-conical shape of the second outer refracting surface 452 of illumination system 400 refracts light in the same manner as the spherical shape of the second outer refracting surface 170 of illumination system 100. The light output distribution will be somewhat different for the two cases.

Figure 5A:
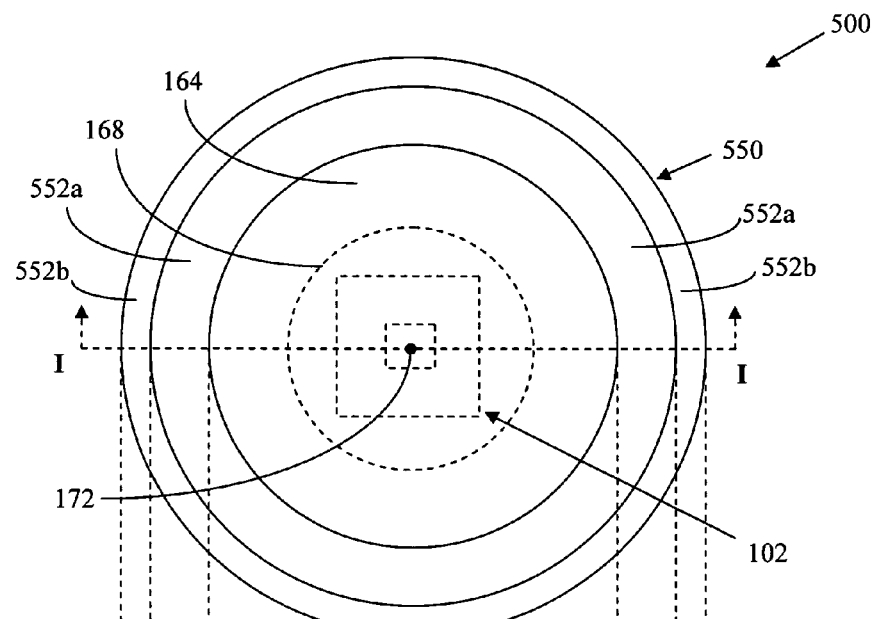
FIG. 5A is a top plan view of another embodiment of an illumination system of this invention. The side-emitting light-recycling lens has a second outer refracting surface with two sections.
Figure 5B:
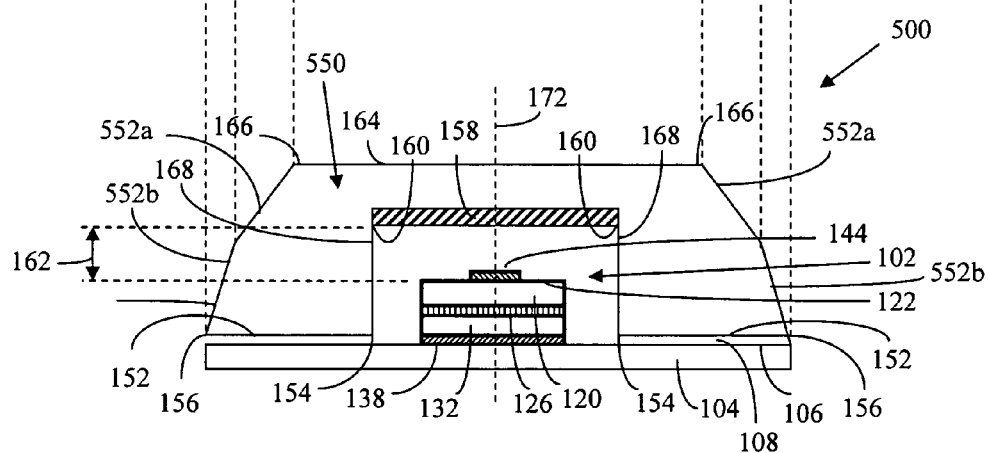
FIG. 5B is a cross-sectional side view along the I-I plane of the illumination system illustrated in FIG. 5A.

Another embodiment of this invention is illumination system 500 illustrated in plan view in FIG. 5A. A cross-sectional view along the I-I plane of the illumination system 500 shown in FIG. 5A is illustrated in FIG. 5B. Illumination system 500 is comprised of LED 102 and side-emitting light-recycling lens 550.

LED 102 has been described previously. Side-emitting light-recycling lens 550 is comprised of a bottom reflecting surface 152, a center reflector 158, a top surface 164, a first inner refracting surface 168 and a second outer refracting surface 552. The bottom reflecting surface 152, the center reflector 158, the top surface 164 and the first inner refracting surface 168 are unchanged from illumination system 100. However, the second outer refracting surface 552 is different than the second outer refracting surface 170 in illumination system 100 and the second outer refracting surface 452 in illumination system 400. The second outer refracting surface 552 has a different shape. The second outer refracting surface 552 of illumination system 500 has two sections, sections 552a and section 552b. Each section has cylindrical symmetry about the axis of symmetry 172 and each section has a frusto-conical shape. Section 552a has a different slope with respect to the axis of symmetry 172 than section 552b. Sections 552a and 552b of the second outer refracting surface 552 have approximately the same overall shape as the second outer refracting surface 170 of illumination system 100. Sections 552a and 552b of the second outer refracting surface 552 refract light in the same manner as the spherical shape of the second outer refracting surface 170 of illumination system 100.

Figure 6A:
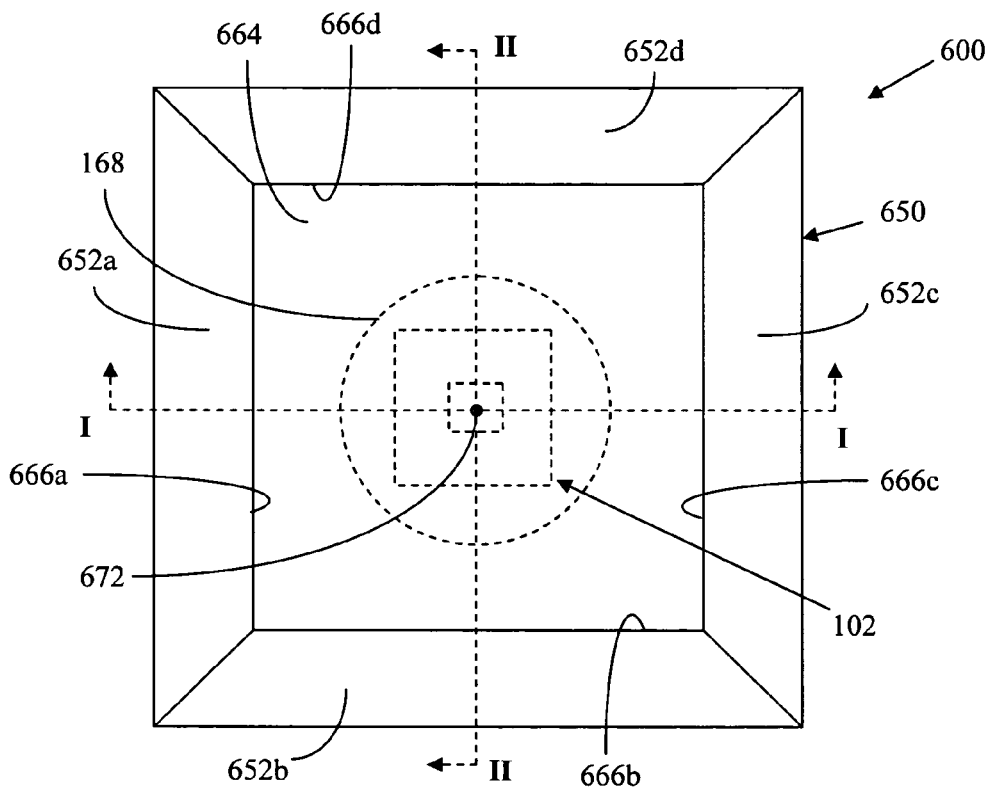
FIG. 6A is a top plan view of another embodiment of an illumination system of this invention. The side-emitting light-recycling lens has 4-fold symmetry.
Figure 6B:
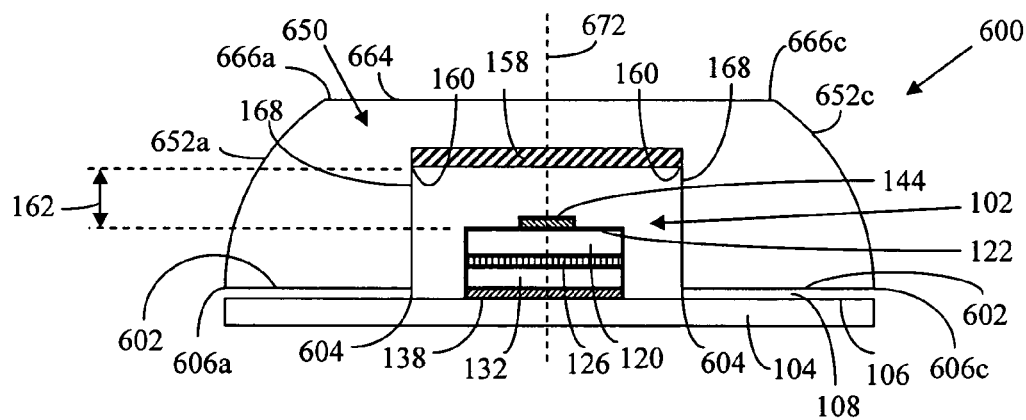
FIG. 6B is a cross-sectional side view along the I-I plane of the illumination system illustrated in FIG. 6A.
Figure 6C:
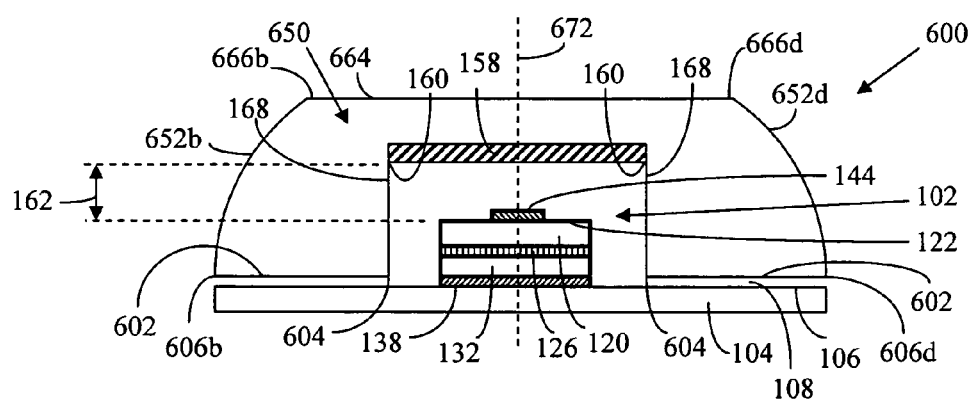
FIG. 6C is a cross-sectional side view along the II-II plane of the illumination system illustrated in FIG. 6A.

Another embodiment of this invention is illumination system 600 illustrated in plan view in FIG. 6A. A cross-sectional view along the I-I plane of the illumination system 600 shown in FIG. 6A is illustrated in FIG. 6B. A cross-sectional view along the II-II plane of the illumination system 600 shown in FIG. 6A is illustrated in FIG. 6C. Illumination system 600 is comprised of LED 102 and side-emitting light-recycling lens 650.

LED 102 has been described previously. Side-emitting light-recycling lens 650 is comprised of a bottom reflecting surface 602, a center reflector 158, a top surface 664, a first inner refracting surface 168 and a second outer refracting surface 652. The center reflector 158 and the first inner refracting surface 168 are unchanged from illumination system 100. The side-emitting light recycling lens 650 has 4-fold symmetry about an axis of symmetry 672.

The bottom reflecting surface 602 is a planar surface with a single first edge 604 proximal to the LED 102 and a second edge 606 that has four sections, section 606a, section 606b, section 606c and section 606d, distal from LED 102. The first edge 604 has the shape of a circle. The sections 606a, 606b, 606c and 606d of the second edge 606 have the shape of a square.

The top surface 664 is distal from LED 102. The top surface 664 is planar and has a fourth edge 666 with four sections, section 666a, section 666b, section 666c and section 666d. The four sections, 666a, 666b, 666c and 666d, of the fourth edge 666 have the shape of a square.

The second outer refracting surface 652 is a curved surface with four sections, 652a, 652b, 652c and 652d. Section 652a of the second outer refracting surface 652 extends from section 606a of the second edge 606 of the bottom reflecting surface 602 to section 666a of the fourth edge 666 of the top surface 664. Section 652b of the second outer refracting surface 652 extends from section 606b of the second edge 606 of the bottom reflecting surface 602 to section 666b of the fourth edge 666 of the top surface 664. Section 652c of the second outer refracting surface 652 extends from section 606c of the second edge 606 of the bottom reflecting surface 602 to section 666c of the fourth edge 666 of the top surface 664. Section 652d of the second outer refracting surface 652 extends from section 606d of the second edge 606 of the bottom reflecting surface 602 to section 666d of the fourth edge 666 of the top surface 664.

In FIGS. 6A and 6B, sections 652a and 652c of the second outer refracting surface 652 are formed from a section of a first cylinder, where the axis of the first cylinder is parallel to the II-II plane. Sections 652b and 652d of the second outer refracting surface 652 are formed from a section of second cylinder, where the axis of the second cylinder is parallel to the I-I plane. However, it is not required that sections 652a, 652b, 652c and 652d of the second outer refracting surface 652 have the shape of sections of a cylinder. The four sections of the second outer refracting surface 652 refract light in the same manner as the spherical shaped second outer refracting surface 170 of illumination system 100. However, the light output distributions of illumination system 600 and illumination system 100 will be different. Since the side-emitting light-recycling lens 650 in illumination system 600 has 4-fold symmetry about the axis of symmetry 672, the light output of illumination system 600 also has 4-fold symmetry about the axis of symmetry 672. In contrast, side-emitting light-recycling lens 150 in illumination system 100 has cylindrical symmetry about the axis of symmetry 172. Therefore, the light output of illumination system 100 also has cylindrical symmetry about the axis of symmetry 172.

Figure 7A:
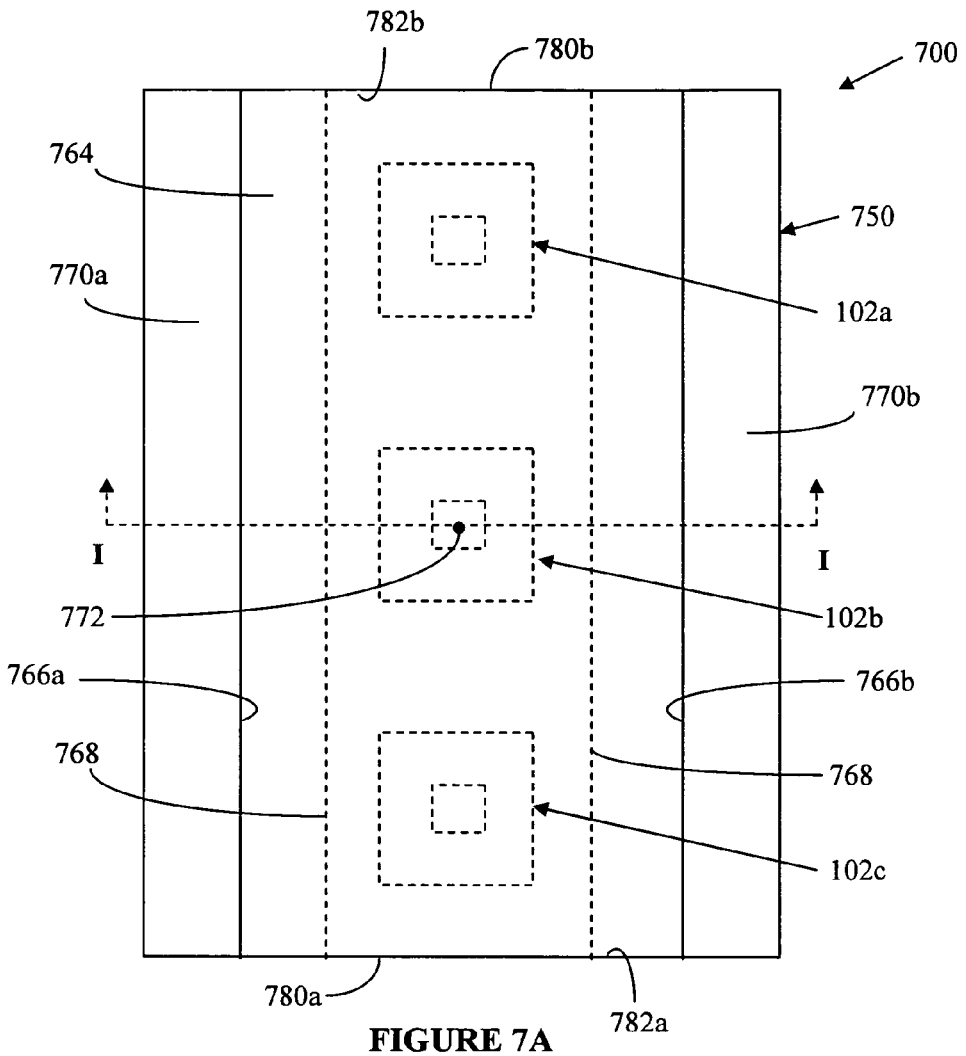
FIG. 7A is a top plan view of another embodiment of an illumination system of this invention that includes three LEDs. The side-emitting light-recycling lens has 2-fold symmetry.
Figure 7B:
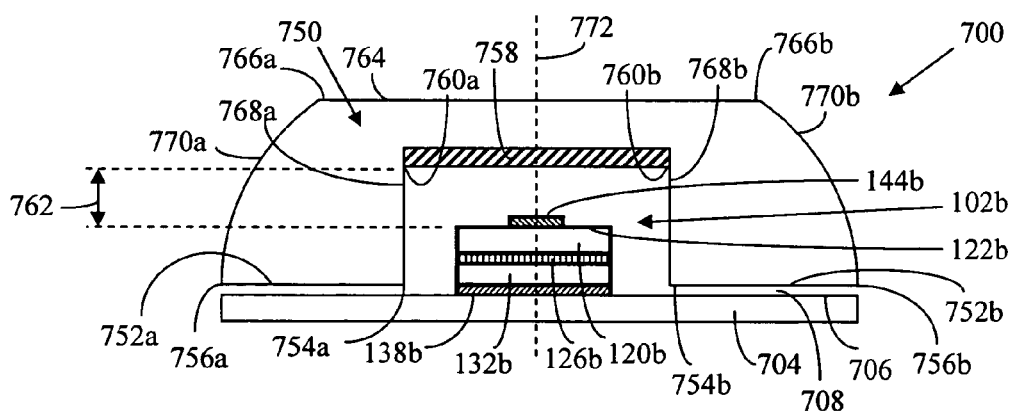
FIG. 7B is a cross-sectional side view along the I-I plane of the illumination system illustrated in FIG. 7A.

Another embodiment of this invention is illumination system 700 illustrated in plan view in FIG. 7A. A cross-sectional view along the I-I plane of the illumination system 700 shown in FIG. 7A is illustrated in FIG. 7B. Illumination system 700 is comprised of three LEDs, 102a, 102b and 102c, and side-emitting light-recycling lens 750. Side-emitting light-recycling lens 750 is comprised of a two bottom reflecting surfaces, 752a and 752b, a center reflector 758, a top surface 764, two first inner refracting surfaces, 768a and 768b, and two second outer refracting surfaces, 770a and 770b.

LEDs 102a, 102b and 102c have the same characteristics as LED 102 in illumination system 100. In FIG. 7A, the three LEDs are equally spaced from each other. However, equal spacing is not necessary. It is also possible to position the LEDs close together rather than separating the LEDs. LEDs 102a, 102b and 102c may all emit the same color of light or the three LEDS may emit two or three colors of light. For example, if the three LEDs each emit a different color of light, the reflection of the three colors of light from the center reflector 758 in illumination system 700 will partially mix the three colors and improve the color uniformity of the light entering the two first inner refracting surfaces, 768a and 768b, and exiting the two second outer refracting surfaces, 770a and 770b. However, in the example shown in FIGS. 7A-7B, complete and uniform mixing will not occur. For example, if LED 102a emits red light, LED 102b emits green light and LED 102c emits blue light, predominantly red light will enter the two first inner refracting surfaces, 768a and 768b nearest LED 102a, predominantly green light will enter the two first inner refracting surfaces, 768a and 768b nearest LED nearest LED 102b and predominantly blue light will enter the two first inner refracting surfaces, 768a and 768b nearest LED 102c. In order to improve light mixing, LEDs 102a, 102b and 102c should be positioned close together and the area of the center reflector 758 should be larger than the total output areas of LEDs 102a, 102b and 102c. Increasing the area of the center reflector 758 can improve light mixing.

As stated previously, side-emitting light-recycling lens 750 is comprised of a two bottom reflecting surfaces, 752a and 752b, a center reflector 758, a top surface 764, two first inner refracting surfaces, 768a and 768b, and two second outer refracting surfaces, 770a and 770b. The side-emitting light-recycling lens 750 also has two end surfaces, end 780a and end 780b. The side-emitting light-recycling lens 750 has 2-fold symmetry about an axis of symmetry 772.

The side-emitting light-recycling lens 750 has a uniform cross-section in a direction perpendicular to the I-I plane. The cross-section of the side-emitting light-recycling lens is illustrated in FIG. 7B along with the cross-section of LED 102b. Since the cross-section of the side-emitting light-recycling lens is uniform, the lens may be fabricated from a plastic material using an extrusion process. Plastic materials that can be used to fabricate the side-emitting light-recycling lens 750 were listed previously for side-emitting light-recycling lens 150 in illumination system 100.

The bottom reflecting surfaces 752a and 752b are planar surfaces. The bottom reflecting surface 752a has a first edge 754a proximal to the LED 102 and a second edge 756a distal from LED 102. The bottom reflecting surface 752b has a first edge 754b proximal to the LED 102 and a second edge 756b distal from LED 102.

The center reflector 758 is a planar reflector with third edges 760a and 760b. Center reflector 758 is constructed from the same materials as center reflector 158 in illumination system 100. Center reflector 758 is separated from the output surface 122a of LEDs 102a, output surface 122b of LED 102b and output surface 122c of LED 102c by separation distance 762.

The top surface 764 is distal from LEDs 102a, 102b and 102c. The top surface 764 is planar and has two fourth edges 766a and 766b, as well as two end edges 782a and 782b.

There are two first inner refracting surfaces, 768a and 768b. The first inner refracting surface 768a extends from the first edge 754a of the bottom reflecting surface 752a to the third edge 760a of the center reflector 758. The first inner refracting surface 768b extends from the first edge 754b of the bottom reflecting surface 752b to the third edge 760b of the center reflector 758. In FIGS. 7A and 7B, first inner refracting surfaces 768a and 768b are planar surfaces, where the planes are parallel to the axis of symmetry 772. However, it is not required that first inner refracting surfaces 768a and 768b be planar surfaces. For example the first inner refracting surfaces 768a and 768b may be curved or faceted.

There are two second outer refracting surfaces, 770a and 770b. Second outer refracting surface 770a extends from the second edge 756a of bottom reflecting surface 752a to the fourth edge 766a of the top surface 764. Second outer refracting surface 770b extends from the second edge 756b of bottom reflecting surface 752b to the fourth edge 766b of the top surface 764. The second outer refracting surfaces 770a and 770b may have many shapes, including planar, curved and faceted. In FIGS. 7A and 7B, the second outer refracting surfaces 770a and 770b are formed from a section of a cylinder, where the axis of the cylinder is perpendicular to the I-I plane. However, it is not required that second outer refracting surfaces 770a and 770b be curved surfaces. For example the second outer refracting surfaces 770a and 770b may be planar or faceted.

The light distribution exiting illumination system 700 differs from the light distribution exiting illumination system 100. The side-emitting light-recycling lens 750 in illumination system 700 has 2-fold symmetry about the axis of symmetry 772. The light emitted by illumination system 700 will also have 2-fold symmetry about the axis of symmetry 772. In contrast, side-emitting light-recycling lens 150 in illumination system 100 has cylindrical symmetry about the axis of symmetry 172. Therefore, the light output of illumination system 100 also has cylindrical symmetry about the axis of symmetry 172.

Figure 8:
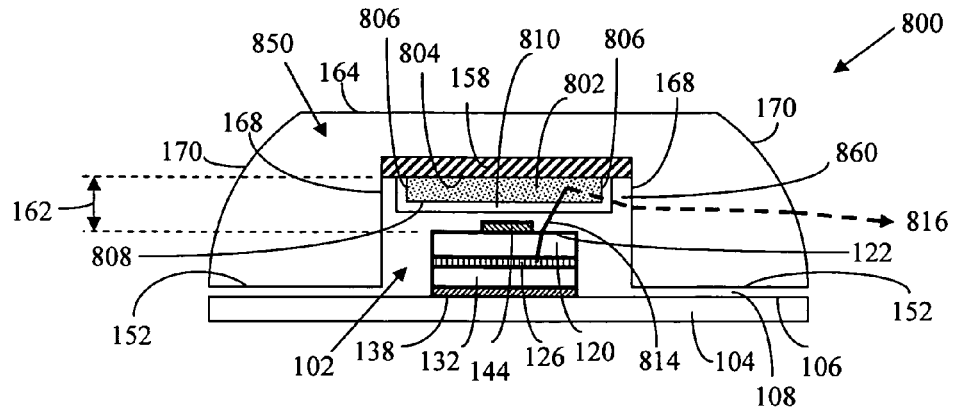
FIG. 8 is a cross-sectional side view of an embodiment of an illumination system of this invention that includes a wavelength conversion layer disposed on the center reflector.
Figure 9:
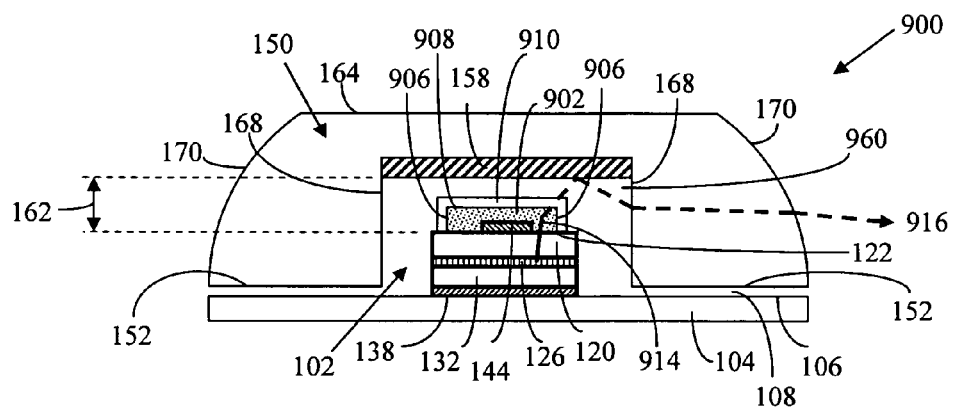
FIG. 9 is a cross-sectional side view of an embodiment of an illumination system of this invention that includes a wavelength conversion layer disposed on the LED.
Figure 10:
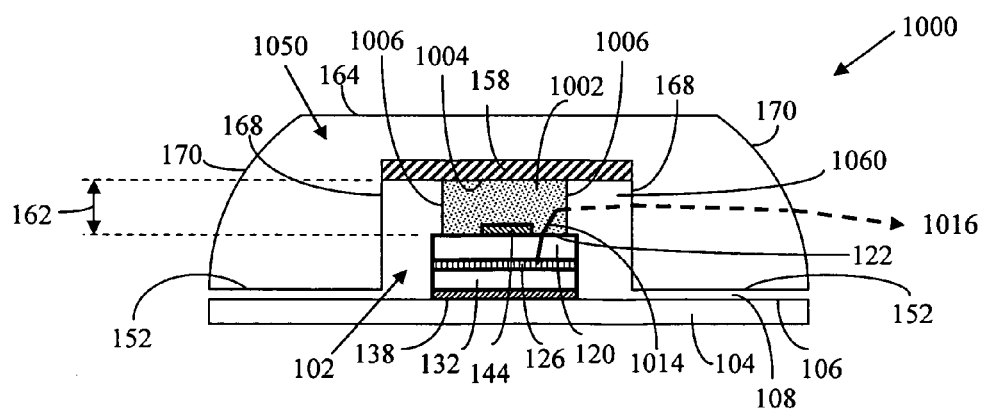
FIG. 10 is a cross-sectional side view of an embodiment of an illumination system of this invention that includes a wavelength conversion layer disposed in the region between the center reflector and the output surface of the LED.

FIGS. 8-10 illustrate other embodiments of this invention that further comprise a wavelength conversion layer.

Illumination system 800 is illustrated in cross-section in FIG. 8. Illumination system 800 is similar to illumination system 100 illustrated in FIGS. 1A-1I except that illumination system 800 includes a wavelength conversion layer 802 and an optional transparent overcoat layer 810.

Illumination system 800 is comprised of LED 102 and side-emitting light-recycling lens 850. LED 102 has been described previously. Side-emitting light recycling lens 850 is comprised of a bottom reflecting surface 152, a center reflector 158, a top surface 164, a first inner refracting surface 168, a second outer refracting surface 170, a wavelength conversion layer 802 and an optional overcoat layer 810. The bottom reflecting surface 152, the center reflector 158, the top surface 164, the first inner refracting surface 168 and the second outer refracting surface 170 have been described previously for illumination system 100.

The wavelength conversion layer 802 is disposed on surface 804 of center reflector 158. The wavelength conversion layer has side surface 806 and bottom surface 808. For illustrative purposes, the wavelength conversion layer 802 is illustrated in FIG. 8 to only partially cover surface 804 of center reflector 158. The partial coverage prevents any wavelength-converted light emitted from the side surfaces 806 of the wavelength conversion layer 802 from directly entering the first inner refracting surface 168 without first passing through a region of low refractive index (for example, air). However, wavelength conversion layer 802 may completely cover surface 804 if the wavelength conversion layer is thin enough to minimize any light directly entering the first inner refracting surface 168. The wavelength conversion layer 802 converts the internally generated light of a first color emitted by the active region 126 of LED 102 into light of a second color, different than the first color.

The wavelength conversion layer 802 is comprised of a phosphor material, a quantum dot material or a plurality of such materials. The wavelength conversion layer may further comprise a transparent host material into which the phosphor material or the quantum dot material is dispersed. Wavelength conversion layers that contain powdered phosphor materials can scatter light. When wavelength conversion layer 802 scatters light, it can also transmit and reflect portions of the scattered light.

Phosphor materials are typically optical inorganic materials doped with ions of lanthanide (rare earth) elements or, alternatively, ions such as chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ((lanthanide)$(Mg,Zn)B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3:Eu^{3+}$. An exemplary yellow emitting phosphor is $YAG:Ce^{3+}$. Exemplary green emitting phosphors include $CeMgAl_{11}O_{19}:Tb^{3+}$, ((lanthanide)$PO_4:Ce^{3+}$, $Tb^{3+}$) and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include $YAG:Ce^{3+}$, $YAG:Ho^{3+}$, $YAG:Pr^{3+}$, $SrGa_2S_4:Eu^{2+}$, $SrGa_2S_4:Ce^{3+}$, $SrS:Eu^{2+}$ and nitridosilicates doped with $Eu^{2+}$.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at one wavelength and then re-emit the light at different wavelengths that depend on the particle size, the particle surface properties, and the inorganic semiconductor material.

The transparent host materials include polymer materials and inorganic materials. The polymer materials include, but are not limited to, acrylates, polystyrene, polycarbonate, fluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A single type of phosphor material or quantum dot material may be incorporated in the wavelength conversion layer 802 or a mixture of phosphor materials and quantum dot materials may be incorporated into the wavelength conversion layer. Utilizing a mixture of more than one such material is advantageous if a broad spectral emission range is desired.

Optionally, a transparent overcoat layer 810 covers side surface 806 and bottom surface 808 of wavelength conversion layer 802. Transparent overcoat layer 810 prevents moisture and/or oxygen from reaching wavelength conversion layer 802. Some types of phosphors such as sulfide materials, for example, are susceptible to damage from moisture. Overcoat layer 810 can be fabricated from any transparent material that blocks moisture and/or oxygen from reaching wavelength conversion layer 802. Example overcoat layer materials include inorganic materials such as silicon dioxide, silicon nitride or aluminum oxide, polymer materials or hybrid polymer/inorganic layers. Preferred overcoat materials are silicon dioxide and silicon nitride. In this embodiment, preferably the center reflector 158 and/or the structure of the side-emitting light-recycling lens 850 are impervious to moisture and/or oxygen.

Alternatively, the side-emitting light-recycling lens 850 is bonded to top surface 106 of base 104, providing a sealed enclosure that can protect the wavelength conversion layer 802 from moisture and/or oxygen. The interior 860 of illumination system 800 can be then be filled with an inert atmosphere or evacuated. The inert atmosphere and vacuum are optically transparent to the light of a first color and the light of a second color.

In another alternative design, a sealed transparent enclosure (not shown) can be placed around illumination system 800 in order to prevent degradation of the wavelength conversion layer by moisture or oxygen. The sealed transparent enclosure may be, for example, a glass envelope that is filled with an inert gas or evacuated. The inert atmosphere and vacuum are optically transparent to the light of a first color and the light of a second color.

Example light rays 814 and 816 illustrate the operation of illumination system 800. Internally generated light ray 814 of a first color is emitted by active region 126 of LED 102 and directed to surface 122. Light ray 814 of a first color is transmitted by surface 122 and is directed to transparent overcoat layer 810. Light ray 814 of a first color is transmitted by transparent overcoat layer 810 and is directed into wavelength conversion layer 802. Wavelength conversion layer 802 converts light ray 814 of a first color into light ray 816 of a second color. The second color is different than the first color. The light of a second color can be emitted in any direction from the point of wavelength conversion. Light ray 816 of a second color is transmitted through the side 806 of wavelength conversion layer 802, through transparent overcoat layer 810 and is directed to the first inner refracting surface 168. Light ray 816 of a second color is refracted by the first inner refracting surface 168, is transmitted through the side-emitting light recycling lens 850 and is directed to the second outer refracting surface 170. Light ray 816 is refracted by the second outer refracting surface 170 and exits illumination system 800 in a direction substantially parallel to the bottom reflecting surface 152.

Another embodiment of this invention is illumination system 900 illustrated in cross-section in FIG. 9. Illumination system 900 is similar to illumination system 100 illustrated in FIGS. 1A-1I except that illumination system 900 includes a wavelength conversion layer 902 and an optional transparent overcoat layer 910.

Illumination system 900 is comprised of LED 102, side-emitting light-recycling lens 150, a wavelength conversion layer 902 and an optional overcoat layer 910. LED 102 and side-emitting light-recycling lens 150 have been described previously.

The wavelength conversion layer 902 is disposed on surface 122 of LED 102. The wavelength conversion layer has side surfaces 906 and top surface 908. The wavelength conversion layer 902 converts the internally generated light of a first color emitted by the active region 126 of LED 102 into light of a second color, different than the first color. For illustrative purposes, the wavelength conversion layer 902 does not completely cover surface 122 of LED 102. Alternatively, the wavelength conversion layer can cover the entire surface 122 of LED 102. Changing the coverage of the wavelength conversion layer on surface 122 changes the ratio of the amount of light of a first color to the amount of light of second color exiting the illumination system. Since wavelength conversion layer 902 also covers first reflecting electrode 144 of LED 102, a pathway (not shown) must be provided to allow the fabrication of an electrical connection to first reflecting electrode 144.

The wavelength conversion layer 902 is comprised of a phosphor material, a quantum dot material or a plurality of such materials. The wavelength conversion layer 902 may further comprise a transparent host material into which the phosphor material or the quantum dot material is dispersed. Example phosphor materials, quantum dot materials and transparent host materials have been listed previously for wavelength conversion layer 802. Wavelength conversion layers that contain powdered phosphor materials can scatter light. When wavelength conversion layer 902 scatters light, it can also transmit and reflect portions of the scattered light.

Optionally, a transparent overcoat layer 910 covers side surfaces 906 and top surface 908 of wavelength conversion layer 902. Transparent overcoat layer 910 prevents moisture and/or oxygen from reaching wavelength conversion layer 902. Some types of phosphors such as sulfide materials, for example, are susceptible to damage from moisture. Overcoat layer 910 can be fabricated from any transparent material that blocks moisture and/or oxygen from reaching wavelength conversion layer 902. Example overcoat layers have been listed previously for overcoat layer 810.

Alternatively, the side-emitting light-recycling lens 150 is bonded to top surface 106 of base 104, providing a sealed enclosure that can protect the wavelength conversion layer 902 from moisture and/or oxygen. The interior 960 of illumination system 900 can be then be filled with an inert atmosphere or evacuated. The inert atmosphere and vacuum are optically transparent to the light of a first color and the light of a second color.

In another alternative design, a sealed transparent enclosure (not shown) can be placed around illumination system 900 in order to prevent degradation of the wavelength conversion layer by moisture or oxygen. The sealed transparent enclosure may be, for example, a glass envelope that is filled with an inert gas or evacuated. The inert atmosphere and vacuum are optically transparent to the light of a first color and the light of a second color.

Example light rays 914 and 966 illustrate the operation of illumination system 900. Internally generated light ray 914 of a first color is emitted by active region 126 of LED 102 and directed to surface 122. Light ray 914 of a first color is transmitted by surface 122 and is directed into wavelength conversion layer 902. Wavelength conversion layer 902 converts light ray 914 of a first color into light ray 916 of a second color. The second color is different than the first color. The light of a second color can be emitted in any direction from the point of wavelength conversion. Light ray 916 of a second color is directed through the top surface 908 of wavelength conversion layer 902, through transparent overcoat layer 910 and is directed to the center reflector 158. Light ray 916 of a second color is reflected by the center reflector 158 and is directed to the first inner refracting surface 168. Light ray 916 of a second color is refracted by the first inner refracting surface 168, is transmitted through the side-emitting light recycling lens 150 and is directed to the second outer refracting surface 170. Light ray 916 is refracted by the second outer refracting surface 170 and exits illumination system 900 in a direction substantially parallel to the bottom reflecting surface 152.

Another embodiment of this invention is illumination system 1000 illustrated in cross-section in FIG. 10. Illumination system 1000 is similar to illumination system 100 illustrated in FIGS. 1A-1I except that illumination system 1000 includes a wavelength conversion layer 1002.

Illumination system 1000 is comprised of LED 102 and side-emitting light-recycling lens 1050. LED 102 has been described previously. Side-emitting light recycling lens 1050 is comprised of a bottom reflecting surface 152, a center reflector 158, a top surface 164, a first inner refracting surface 168, a second outer refracting surface 170 and a wavelength conversion layer 1002. The bottom reflecting surface 152, the center reflector 158, the top surface 164, the first inner refracting surface 168 and the second outer refracting surface 170 have been described previously for illumination system 100.

The wavelength conversion layer 1002 spans the gap between surface 122 of LED 102 and surface 1004 of top reflector 158. Wavelength conversion layer 1002 has side surface 1006. The wavelength conversion layer 1002 converts the internally generated light of a first color emitted by the active region 126 of LED 102 into light of a second color, different than the first color. For illustrative purposes, the wavelength conversion layer 1002 does not completely cover surface 122 of LED 102. Alternatively, the wavelength conversion layer can cover the entire surface 122 of LED 102. Changing the coverage of the wavelength conversion layer on surface 122 changes the ratio of the amount of light of a first color to the amount of light of second color exiting the illumination system. Since wavelength conversion layer 1002 also covers first reflecting electrode 144 of LED 102, a pathway (not shown) must be provided to allow the fabrication of an electrical connection to first reflecting electrode 144.

The wavelength conversion layer 1002 is comprised of a phosphor material, a quantum dot material or a plurality of such materials. The wavelength conversion layer 1002 may further comprise a transparent host material into which the phosphor material or the quantum dot material is dispersed. Example phosphor materials, quantum dot materials and transparent host materials have been listed previously for wavelength conversion layer 802. Wavelength conversion layers that contain powdered phosphor materials can scatter light. When wavelength conversion layer 1002 scatters light, it can also transmit and reflect portions of the scattered light.

As noted previously, some types of phosphors such as sulfide materials, for example, are susceptible to damage from moisture. Optionally, the side-emitting light-recycling lens 1050 is bonded to top surface 106 of base 104, providing a sealed enclosure that can protect the wavelength conversion layer 1002 from moisture and/or oxygen. The interior 1060 of illumination system 1000 can be then be filled with an inert atmosphere or evacuated. The inert atmosphere and vacuum are optically transparent to the light of a first color and the light of a second color.

In another alternative design, a sealed transparent enclosure (not shown) can be placed around illumination system 1000 in order to prevent degradation of the wavelength conversion layer by moisture or oxygen. The sealed transparent enclosure may be, for example, a glass envelope that is filled with an inert gas or evacuated. The inert atmosphere and vacuum are optically transparent to the light of a first color and the light of a second color.

Example light rays 1014 and 1016 illustrate the operation of illumination system 1000. Internally generated light ray 1014 of a first color is emitted by active region 126 of LED 102 and directed to surface 122. Light ray 1014 of a first color is transmitted by surface 122 and is directed into wavelength conversion layer 1002. Wavelength conversion layer 1002 converts light ray 1014 of a first color into light ray 1016 of a second color. The second color is different than the first color. The light of a second color can be emitted in any direction from the point of wavelength conversion. Light ray 1016 of a second color is directed through side surface 1006 of wavelength conversion layer 1002 and directed to the first inner refracting surface 168. Light ray 1016 of a second color is refracted by the first inner refracting surface 168, is transmitted through the side-emitting light recycling lens 1050 and is directed to the second outer refracting surface 170. Light ray 1016 is refracted by the second outer refracting surface 170 and exits illumination system 1000 in a direction substantially parallel to the bottom reflecting surface 152.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An illumination system, comprising:
    a light emitting diode having
        a first doped semiconductor layer having an output surface;
        a second doped semiconductor layer, said second doped semiconductor layer and said first doped semiconductor layer having opposite n and p conductivity types;
        an active region interposed between said first doped semiconductor layer and said second doped semiconductor layer, said active region in electrical contact with said first doped semiconductor layer and said second doped semiconductor layer;
        a first reflecting electrode in electrical contact with said first doped semiconductor layer;
        a second reflecting electrode in electrical contact with said second doped semiconductor layer;
    a side-emitting light-recycling lens having
        a bottom reflecting surface having a first edge proximal to said light emitting diode and a second edge distal from said light emitting diode;
        a center reflector proximal to said light emitting diode, wherein said center reflector is opposite said output surface of said light emitting diode, wherein said center reflector is separated from said output surface and wherein said center reflector has a third edge;
        a top surface distal from said light emitting diode, wherein said top surface has a fourth edge;

a first inner refracting surface extending from said first edge of said bottom reflecting surface to said third edge of said center reflector; and a second outer refracting surface extending from said second edge of said bottom reflecting surface to said fourth edge of said top surface;

wherein an internally generated light emitted through said output surface of said light emitting diode is directed to said center reflector or is directed through said first inner refracting surface;

wherein an internally generated light directed to said center reflector is subsequently reflected by said center reflector and is redirected through said first inner refracting surface or is recycled back to said light emitting diode as said externally incident light;

wherein a portion of said externally incident light recycled back to said light emitting diode is reflected by said first reflecting electrode and said second reflecting electrode, thereby increasing the effective brightness of said light emitting diode, and wherein said portion is redirected to said center reflector or is redirected through said first inner refracting surface;

wherein a first fraction of said internally generated light and said externally incident light is directed through said first inner refracting surface, is directed through said side-emitting light-recycling lens and is directed through said second outer refracting surface, exiting said side-emitting light-recycling lens in a direction substantially parallel to the bottom reflecting surface;

wherein a second fraction of said internally generated light and said externally incident light is directed through said first inner refracting surface, is directed through said side-emitting light-recycling lens, is directed to said bottom reflecting surface, is reflected by said bottom reflecting surface, is directed through said side-emitting light-recycling lens and is directed through said second outer refracting surface, exiting said side-emitting, light-recycling lens in a direction substantially parallel to said bottom reflecting surface; and wherein said externally incident light that is reflected by said light emitting diode and that exits said side-emitting light-recycling lens increases the brightness and efficiency of said illumination system.

2. An illumination system as in claim 1, wherein said center reflector is a diffuse reflector.

3. An illumination system as in claim 1, wherein said center reflector is a specular reflector.

4. An illumination system as in claim 2, wherein said center reflector is a substantially planar surface.

5. An illumination system as in claim 4, wherein the separation distance between said center reflector and said output surface of said light emitting diode is less than 4 millimeters.

6. An illumination system as in claim 5, wherein said separation distance is less than 2 millimeters.

7. An illumination system as in claim 2, wherein said center reflector has the shape of an inverted peak or is curved.

8. An illumination system as in claim 7, wherein the separation distance between said center reflector and said output surface of said light emitting diode increases from the center of said center reflector to said third edge of said center reflector.

9. An illumination system as in claim 1, wherein said bottom reflecting surface is a planar surface.

10. An illumination system as in claim 9, wherein said bottom reflecting surface is a specular reflector.

11. An illumination system as in claim 10, wherein said bottom reflecting surface reflects light by total internal reflection.

12. An illumination system as in claim 1, wherein said first inner refracting surface is substantially perpendicular to said bottom reflecting surface.

13. An illumination system as in claim 1, wherein said system comprises is a plurality of said light emitting diode.

14. An illumination system as in claim 13, wherein said plurality of said light emitting diode emit more than one color of light.

15. An illumination system as in claim 1, wherein said side-emitting light-recycling lens is cylindrically symmetric about an axis of symmetry.

16. An illumination system as in claim 1, wherein said side-emitting light-recycling lens is 2-fold symmetric about an axis of symmetry.

17. An illumination system as in claim 1, wherein said side-emitting light-recycling lens is 4-fold symmetric about an axis of symmetry.

18. An illumination system as in claim 1, wherein said second outer refracting surface of said side-emitting light-recycling lens is curved.

19. An illumination system as in claim 1, wherein said second outer refracting surface of said side-emitting light-recycling lens is faceted.

20. An illumination system as in claim 1, wherein said second outer refracting surface of said side-emitting light-recycling lens is frusto-conical.

21. An illumination system as in claim 1, wherein said light emitting diode reflects said externally incident light with a reflectivity greater than 40 percent.

22. An illumination system as in claim 21, wherein said light emitting diode reflects said externally incident light with a reflectivity greater than 50 percent.

23. An illumination system as in claim 22, wherein said light emitting diode reflects said externally incident light with a reflectivity greater than 60 percent.

24. An illumination system as in claim 1, wherein said illumination system includes a wavelength conversion layer.

25. An illumination system as in claim 24, wherein said wavelength conversion layer is disposed on said center reflector.

26. An illumination system as in claim 24, wherein said wavelength conversion layer is disposed on said light emitting diode.

27. An illumination system as in claim 24, wherein said wavelength conversion layer spans the gap between said center reflector and said output surface of said light emitting diode.

* * * * *